United States Patent
Hwang et al.

(10) Patent No.: US 12,332,680 B2
(45) Date of Patent: Jun. 17, 2025

(54) MEMORY SYSTEM RELATED TO CLOCK SYNCHRONIZATION

(71) Applicant: SK hynix Inc., Icheon-si (KR)

(72) Inventors: Kyu Dong Hwang, Icheon-si (KR); Sang Sic Yoon, Icheon-si (KR)

(73) Assignee: SK hynix Inc., Gyeonggi-do (KR)

( * ) Notice: Subject to any disclaimer, the term of this patent is extended or adjusted under 35 U.S.C. 154(b) by 175 days.

(21) Appl. No.: 18/107,914

(22) Filed: Feb. 9, 2023

(65) Prior Publication Data
US 2023/0305592 A1  Sep. 28, 2023

Related U.S. Application Data

(60) Provisional application No. 63/314,128, filed on Feb. 25, 2022.

(30) Foreign Application Priority Data

Nov. 22, 2022 (KR) ........................ 10-2022-0157256

(51) Int. Cl.
*G11C 16/04* (2006.01)
*G06F 1/08* (2006.01)
*G06F 1/12* (2006.01)
*G11C 7/22* (2006.01)

(52) U.S. Cl.
CPC .................. *G06F 1/08* (2013.01); *G06F 1/12* (2013.01); *G11C 7/222* (2013.01)

(58) Field of Classification Search
CPC ...................................................... G11C 7/222
See application file for complete search history.

(56) References Cited

U.S. PATENT DOCUMENTS

| | | | | |
|---|---|---|---|---|
| 7,518,935 B2 * | 4/2009 | Jakobs | ................ | G06F 13/1689 365/189.05 |
| 9,471,484 B2 * | 10/2016 | Oh | ...................... | G06F 13/1668 |
| 11,194,726 B2 * | 12/2021 | Gans | ................... | G06F 13/4247 |
| 2021/0343328 A1 | 11/2021 | Shin et al. | | |
| 2022/0027067 A1 | 1/2022 | Suh et al. | | |

* cited by examiner

*Primary Examiner* — Pho M Luu
(74) *Attorney, Agent, or Firm* — WILLIAM PARK & ASSOCIATES LTD.

(57) ABSTRACT

A memory system includes a memory controller and a memory device. The memory controller accesses the memory device by providing a system clock signal, a data clock signal, and a chip selection signal and provides a data clock enable signal to the memory device after the access to the memory device. The memory device communicates with the memory controller based on the system clock signal, the data clock signal, and the data clock enable signal.

18 Claims, 11 Drawing Sheets

MEMORY SYSTEM RELATED TO CLOCK SYNCHRONIZATION

CROSS-REFERENCES TO RELATED APPLICATION

The present application claims the benefit of U.S. Provisional Application No. 63/314,128, filed on Feb. 25, 2022, and claims priority under 35 U.S.C. § 119 (a) to Korean Application No. 10-2022-0157256, filed on Nov. 22, 2022, in the Korean Intellectual Property Office, which is incorporated herein by reference in its entirety as set forth in full.

BACKGROUND

1. Technical Field

Various embodiments generally relate to an integrated circuit technology, and, more particularly, to a memory controller, a memory device and a memory system related to clock synchronization.

2. Related Art

An electronic device includes a lot of electronic elements and a computer system as the electronic device includes lots of semiconductor apparatuses each configured by a semiconductor. The semiconductor apparatuses configuring the computer system may include a processor or a memory controller, which is configured to operate as a master device, and a memory device or a storage device, which is configured to operate as a slave device. The master device may provide the slave device with a command address signal. The slave device may perform data communication with the master device based on the command address signal.

For improving data communication speed, the computer system may utilize a system clock signal and a data clock signal having a higher frequency than the system clock signal. In synchronization with the system clock signal having a lower frequency, the master device may provide the slave device with the command address signal. In synchronization with the data clock signal having a higher frequency, the master device and the slave device may provide and receive data. Although having different frequencies, the system clock signal and the data clock signal are required to be synchronized with each other in order to prevent malfunction of the semiconductor apparatuses.

SUMMARY

In an embodiment, a memory system may include a memory controller and a memory device. The memory controller may be configured to perform a memory access by providing a system clock signal, a data clock signal, and a chip selection signal, and configured to provide a data clock enable signal after the memory access. The memory device may be configured to communicate with the memory controller based on the system clock signal, the data clock signal, the chip selection signal, and the data clock enable signal.

In an embodiment, a memory system may include a memory controller, a first rank, and a second rank. The memory controller may be configured to provide a system clock signal, a data clock signal, a first chip selection signal, a second chip selection signal, and a data clock enable signal. The first rank may be configured to communicate with the memory controller based on the system clock signal, the data clock signal, the first chip selection signal, and the data clock enable signal. The second rank may be configured to communicate with the memory controller based on the system clock signal, the data clock signal, the second chip selection signal, and the data clock enable signal. The memory controller may be configured to provide the data clock enable signal after accessing at least one of the first rank and the second rank.

In an embodiment, a memory system may include a memory controller, a first rank, a second rank, a third rank, and a fourth rank. The memory controller may be configured to provide a system clock signal, a data clock signal, a first chip selection signal, a second chip selection signal, a first data clock enable signal, and a second data clock enable signal. The first rank may be configured to communicate with the memory controller based on the system clock signal, the data clock signal, the first chip selection signal, and the first data clock enable signal. The second rank may be configured to communicate with the memory controller based on the system clock signal, the data clock signal, the second chip selection signal, and the first data clock enable signal. The third rank may be configured to communicate with the memory controller based on the system clock signal, the data clock signal, the first chip selection signal, and the second data clock enable signal. The fourth rank may be configured to communicate with the memory controller based on the system clock signal, the data clock signal, the second chip selection signal, and the second data clock enable signal.

In an embodiment, a memory system may include a memory controller, a first rank, and a second rank. The memory controller may be configured to provide a system clock signal, a data clock signal, a first chip selection signal, a second chip selection signal, a first data clock enable signal, and a second data clock enable signal. The first rank may be configured to communicate with the memory controller based on the system clock signal, the data clock signal, the first chip selection signal, and the first data clock enable signal. The second rank may be configured to communicate with the memory controller based on the system clock signal, the data clock signal, the second chip selection signal, and the second data clock enable signal.

DETAILED DESCRIPTION

Figure 1:
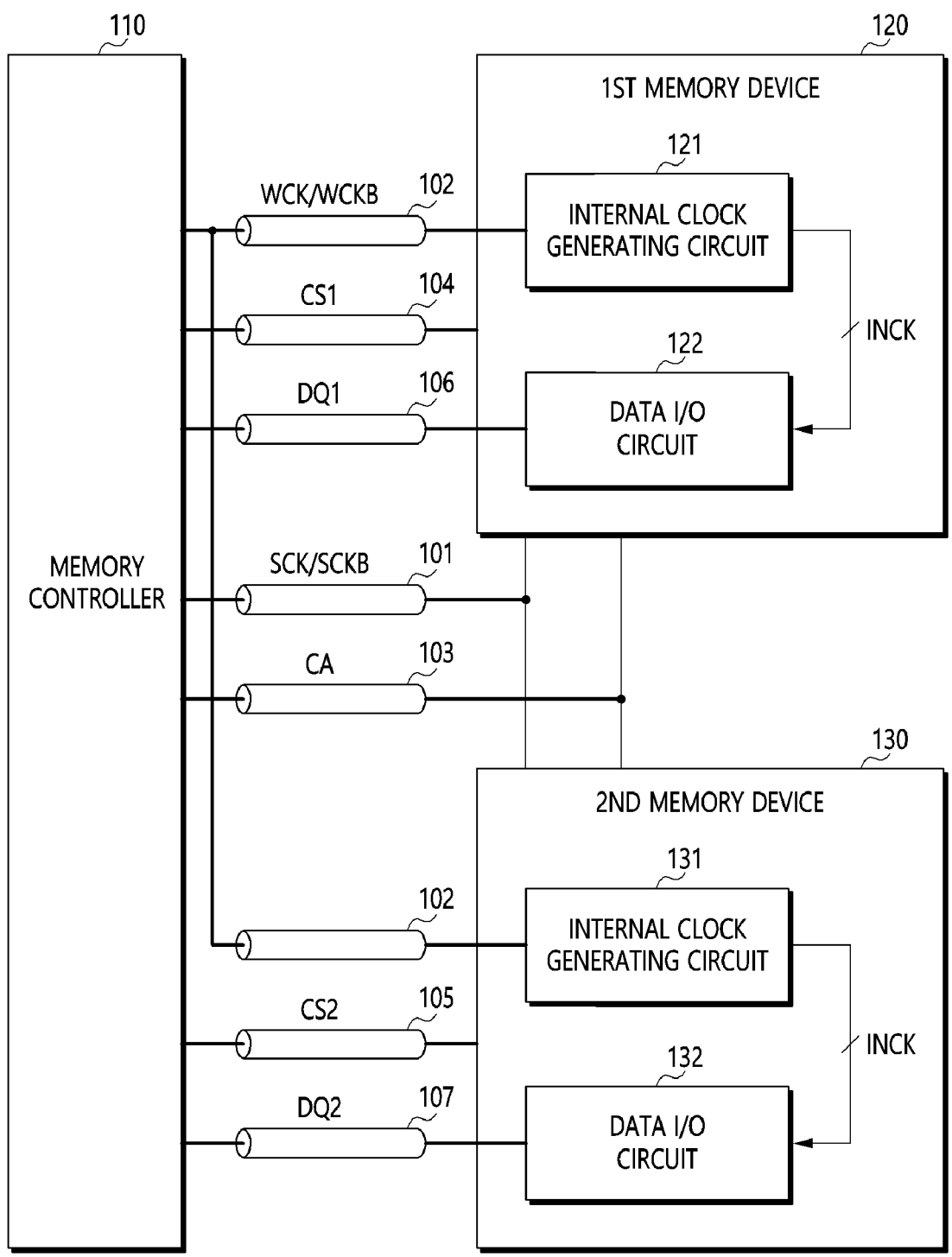
FIG. 1 is a diagram illustrating a configuration of a memory system in accordance with an embodiment.

FIG. 1 is a diagram illustrating a configuration of a memory system 100 in accordance with an embodiment. Referring to FIG. 1, the memory system 100 may include a memory controller 110, a first memory device 120 and a second memory device 130. The memory controller 110 may be a master device and may be configured to provide various control signals to the first memory device 120 and the second memory device 130 in order to access the first memory device 120 and the second memory device 130. The memory controller 110 may be provided within various host devices. For example, the memory controller 110 be provided within a central processing unit (CPU), a graphic processing unit (GPU), a multi-media processor (MMP), a digital signal processor, an application processor (AP) and so forth. Each of the first memory device 120 and the second memory device 130 may be a slave device configured to receive various control signals from the memory controller 110 and configured to perform various operations when accessed by the memory controller 110. Each of the first memory device 120 and the second memory device 130 may include one of a volatile memory and a non-volatile memory. The volatile memory may include a static random access memory (static RAM: SRAM), a dynamic RAM (DRAM) and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

Each of the first memory device 120 and the second memory device 130 may be coupled to the memory controller 110 through a plurality of buses. Each of the plurality of buses may be a signal transmission path, a link or a channel for transferring a signal. The plurality of buses may include a system clock bus 101, a data clock bus 102, a command address bus 103, a first chip selection bus 104, a second chip selection bus 105, a first data bus 106, a second data bus 107 and so forth. Each of the system clock bus 101, the data clock bus 102, the command address bus 103, the first chip selection bus 104 and the second chip selection bus 105 may be a unidirectional bust from the memory controller 110 to each of the first memory device 120 and the second memory device 130. The first data bus 106 and the second data bus 107 may be a bidirectional bus between the memory controller 110 and each of the first memory device 120 and the second memory device 130. The first memory device 120 and the second memory device 130 may be coupled commonly to the system clock bus 101. The memory controller 110 may provide, through the system clock bus 101, system clock signals SCK and SCKB to the first memory device 120 and the second memory device 130. The system clock signals SCK and SCKB may include a system clock signal SCK and a complementary signal SCKB. The system clock signal SCK and the complementary signal SCKB may be transferred as differential signals. In an embodiment, the memory controller 110 may provide the system clock signal SCK as a single-ended signal without providing the complementary signal SCKB. The first memory device 120 and the second memory device 130 may be coupled commonly to the data clock bus 102. The memory controller 110 may provide, through the data clock bus 102, data clock signals WCK and WCKB to the first memory device 120 and the second memory device 130. The data clock signals WCK and WCKB may include a data clock signal WCK and a complementary signal WCKB. The data clock signal WCK and the complementary signal WCKB may be transferred as differential signals. The data clock signals WCK and WCKB may have a higher frequency than the system clock signals SCK and SCKB. In a power-down mode or a low-power mode of the memory system 100, the memory controller 110 might not provide the first memory device 120 and the second memory device 130 with the system clock signals SCK and SCKB. When the memory system 100 is powered up, the memory controller 110 may provide the first memory device 120 and the second memory device 130 with the system clock signals SCK and SCKB regardless of a memory access. When performing a memory access, the memory controller 110 may provide a memory device with the data clock signals WCK and WCKB. When accessed by the memory controller 110, the first memory device 120 and the second memory device 130 may receive the data clock signals WCK and WCKB from the memory controller 110.

The first memory device 120 and the second memory device 130 may be coupled commonly to the command address bus 103. The memory controller 110 may provide, through the command address bus 103, a command address signal CA to the first memory device 120 and the second memory device 130. The command address signal CA may include a command signal and an address signal for accessing the first memory device 120 and the second memory device 130. The first memory device 120 may be coupled to the memory controller 110 through the first chip selection bus 104. The memory controller 110 may provide, through the first chip selection bus 104, a first chip selection signal CS1 to the first memory device 120. The second memory device 130 may be coupled to the memory controller 110 through the second chip selection bus 105. The memory controller 110 may provide, through the second chip selection bus 105, a second chip selection signal CS2 to the second memory device 130. The first chip selection signal CS1 and the second chip selection signal CS2 may be signals for accessing the first memory device 120 and the second memory device 130, respectively, and may be signals for specifying a memory device to operate according to the command address signal CA. The memory controller 110 may access one of the first memory device 120 and the second memory device 130 by providing the command address signal CA and one of the first chip selection signal CS1 and the second chip selection signal CS2. In synchronization with the system clock signals SCK and SCKB, the memory controller 110 may provide the first memory device 120 and the second memory device 130 with the command address signal CA, the first chip selection signal CS1 and the second chip selection signal CS2.

The first memory device 120 may be coupled to the memory controller 110 through the first data bus 106. Through the first data bus 106, the first memory device 120 may provide first data DQ1 to the memory controller 110 or may receive the first data DQ1 from the memory controller 110. The second memory device 130 may be coupled to the memory controller 110 through the second data bus 107. Through the second data bus 107, the second memory device 130 may provide second data DQ2 to the memory controller 110 or may receive the second data DQ2 from the memory controller 110. In synchronization with the data clock signals WCK and WCKB, the memory controller 110 may provide the first memory device 120 and the second memory device 130 with the first data DQ1 and the second data DQ2, respectively. In synchronization with the data clock signals WCK and WCKB, the first memory device 120 may provide the first data DQ1 to the memory controller 110. In synchronization with the data clock signals WCK and WCKB, the second memory device 130 may provide the second data DQ2 to the memory controller 110. Referred to as a write operation may be an operation that the first data DQ1 and the second data DQ2 are transferred from the memory controller 110 respectively to the first memory device 120 and the second memory device 130. Referred to as a read operation may be an operation that the first data DQ1 and the second data DQ2 are transferred respectively from the first memory device 120 and the second memory device 130 to the memory controller 110.

The memory controller 110 may access the first memory device 120 by providing the system clock signals SCK and SCKB, the data clock signals WCK and WCKB and the first chip selection signal CS1. The first memory device 120 may receive the first data DQ1 from the memory controller 110 to perform a write operation and may perform a read operation to provide the first data DQ1 to the memory controller 110. The memory controller 110 may access the second memory device 130 by providing the system clock signals SCK and SCKB, the data clock signals WCK and WCKB and the second chip selection signal CS2. The second memory device 130 may receive the second data DQ2 from the memory controller 110 to perform a write operation and may perform a read operation to provide the second data DQ2 to the memory controller 110.

In an embodiment, the first memory device 120 may be a first rank and the second memory device 130 may be a second rank. A rank may be an operational unit capable of independently performing data communication with the memory controller 110. The first rank and the second rank may be embodied by different memory chips or by different parts within a single memory chip. In an embodiment, each of the first rank and the second rank may include a plurality of memory chips.

The first memory device 120 may include at least an internal clock generating circuit 121 and a data input/output (I/O) circuit 122. The internal clock generating circuit 121 may be coupled to the data clock bus 102 and may receive the data clock signals WCK and WCKB from the memory controller 110. Based on the data clock signals WCK and WCKB, the internal clock generating circuit 121 may generate a plurality of internal clock signals INCK. The internal clock 5 generating circuit 121 may generate the plurality of internal clock signals INCK by frequency-dividing the data clock signals WCK and WCKB. The plurality of internal clock signals INCK may have a frequency, which is lower than the frequency of the data clock signals WCK and WCKB and is equal to or lower than the frequency of the system clock signals SCK and SCKB. The data I/O circuit 122 may be coupled to the first data bus 106. The data I/O circuit 122 may receive the first data DQ1 from the memory controller 110 and may provide the first data DQ1 to the memory controller 110. The data I/O circuit 122 may receive the plurality of internal clock signals INCK from the internal clock generating circuit 121. In synchronization with the internal clock signals INCK, the data I/O circuit 122 may receive the first data DQ1 and may provide the first data DQ1. When receiving the first chip selection signal CS1, the first memory device 120 may perform a write operation or a read operation based on the command address signal CA. When receiving the first chip selection signal CS1 and accessed by the memory controller 110, the first memory device 120 may receive the data clock signals WCK and WCKB and may synchronize the system clock signals SCK and SCKB and the data clock signals WCK and WCKB with each other. Although not illustrated, the first memory device 120 may further include circuits configured to receive the command address signal CA and configured to latch and decode the received command address signal CA. The first memory device 120 may further include a memory cell array, which is coupled to the data I/O circuit 122 and configured to store therein the first data DQ1.

The second memory device 130 may include at least an internal clock generating circuit 131 and a data I/O circuit 132. The internal clock generating circuit 131 may be coupled to the data clock bus 102 and may receive the data clock signals WCK and WCKB from the memory controller 110. Based on the data clock signals WCK and WCKB, the internal clock generating circuit 131 may generate a plurality of internal clock signals INCK. The internal clock generating circuit 131 may generate the plurality of internal clock signals INCK by frequency-dividing the data clock signals WCK and WCKB. The data I/O circuit 132 may be coupled to the second data bus 107. The data I/O circuit 132 may receive the second data DQ2 from the memory controller 110 and may provide the second data DQ2 to the memory controller 110. The data I/O circuit 132 may receive the plurality of internal clock signals INCK from the internal clock generating circuit 131. In synchronization with the internal clock signals INCK, the data I/O circuit 132 may receive the second data DQ2 and may provide the second data DQ2. When receiving the second chip selection signal CS2, the second memory device 130 may perform a write operation or a read operation based on the command address signal CA. When receiving the second chip selection signal CS2 and accessed by the memory controller 110, the second memory device 130 may receive the data clock signals WCK and WCKB and may synchronize the system clock signals SCK and SCKB and the data clock signals WCK and WCKB with each other. Although not illustrated, the second memory device 130 may further include circuits configured to receive the command address signal CA and configured to latch and decode the received command address signal CA. The second memory device 130 may further include a memory cell array, which is coupled to the data I/O circuit 132 and configured to store therein the second data DQ2.

Figure 2:
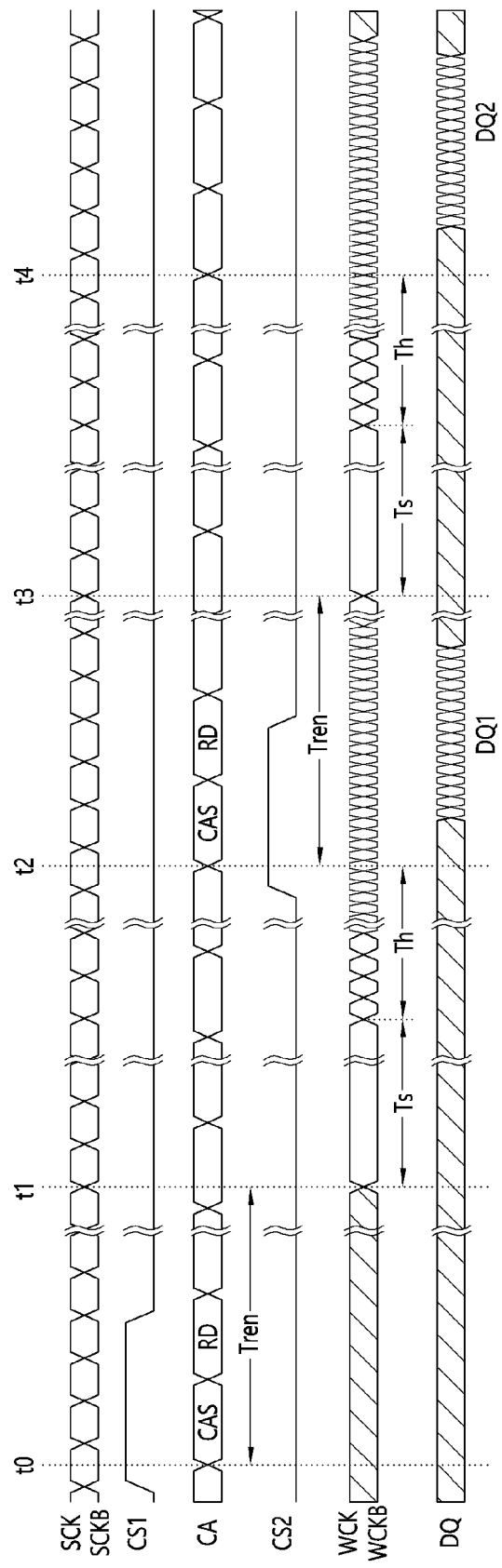
FIG. 2 is a timing diagram illustrating an operation of the memory system illustrated in FIG. 1.

FIG. 2 is a timing diagram illustrating an operation of the memory system 100 illustrated in FIG. 1. Described hereinafter with reference to FIGS. 1 and 2 is the operation of the memory system 100. At a time-point to, the memory controller 110 may provide the first chip selection signal CS1 and the command address signal CA in order to access the first memory device 120. For example, the command address signal CA may be a signal instructing a read operation and may include a column address strobe signal CAS and a read signal RD. When a read enable section Tren elapses after the first chip selection signal CS1 is provided to the first memory device 120, the memory controller 110 may provide the first memory device 120 with the data clock signals WCK and WCKB at a time-point t1. The read enable section Tren may be a time-section, in which a memory device prepares an operation corresponding to the command address signal CA, and a time-section for activating a buffer and/or a driver configured to receive the data clock signals WCK and WCKB and configured to provide and receive data. The data clock signals WCK and WCKB may have a different frequency from the system clock signals SCK and SCKB. Therefore, a static section Ts and a half-rate section Th should take precedence when the data clock signals WCK and WCKB are applied. In the static section Ts, the data clock signal WCK and the complementary signal WCKB may have opposite logic levels to each other. In the half-rate section Th, the frequency of the data clock signal WCK and the complementary signal WCKB may change from a half of an original frequency to the original frequency. A time amount corresponding to the static section Ts and the half-rate section Th may be required for the data clock signals WCK and WCKB having a high frequency to be synchronized with the system clock signals SCK and SCKB having a low frequency. When the static section Ts and the half-rate section Th elapse, the data clock signals WCK and WCKB may start to toggle in synchronization with the system clock signals SCK and SCKB at a time-point t2 and the first memory device 120 may perform the read operation to provide the first data DQ1 to the memory controller 110.

While or after accessing the first memory device 120, the memory controller 110 may access the second memory device 130 by providing the second chip selection signal CS2 and the command address signal CA. At the time-point t2, the memory controller 110 may provide the second memory device 130 with the second chip selection signal CS2 and the command address signal CA while the first memory device 120 is performing the read operation. When the read enable section Tren elapses after receiving the second chip selection signal CS2, the second memory device 130 may receive the data clock signals WCK and WCKB from the memory controller 110 at a time-point t3. Here, the second memory device 130 may require the static section Ts and the half-rate section Th in order to synchronize the data clock signals WCK and WCKB and the system clock signals SCK and SCKB with each other. The memory controller 110 and a memory device cannot perform data communication with each other during the static section Ts and the half-rate section Th, which are therefore "bubbles" decreasing the performance of the memory system 100. When the static section Ts and the half-rate section Th elapse, the data clock signals WCK and WCKB may start to toggle in synchronization with the system clock signals SCK and SCKB at a time-point t4 and the second memory device 130 may perform the read operation to provide the second data DQ2 to the memory controller 110.

Figure 3:
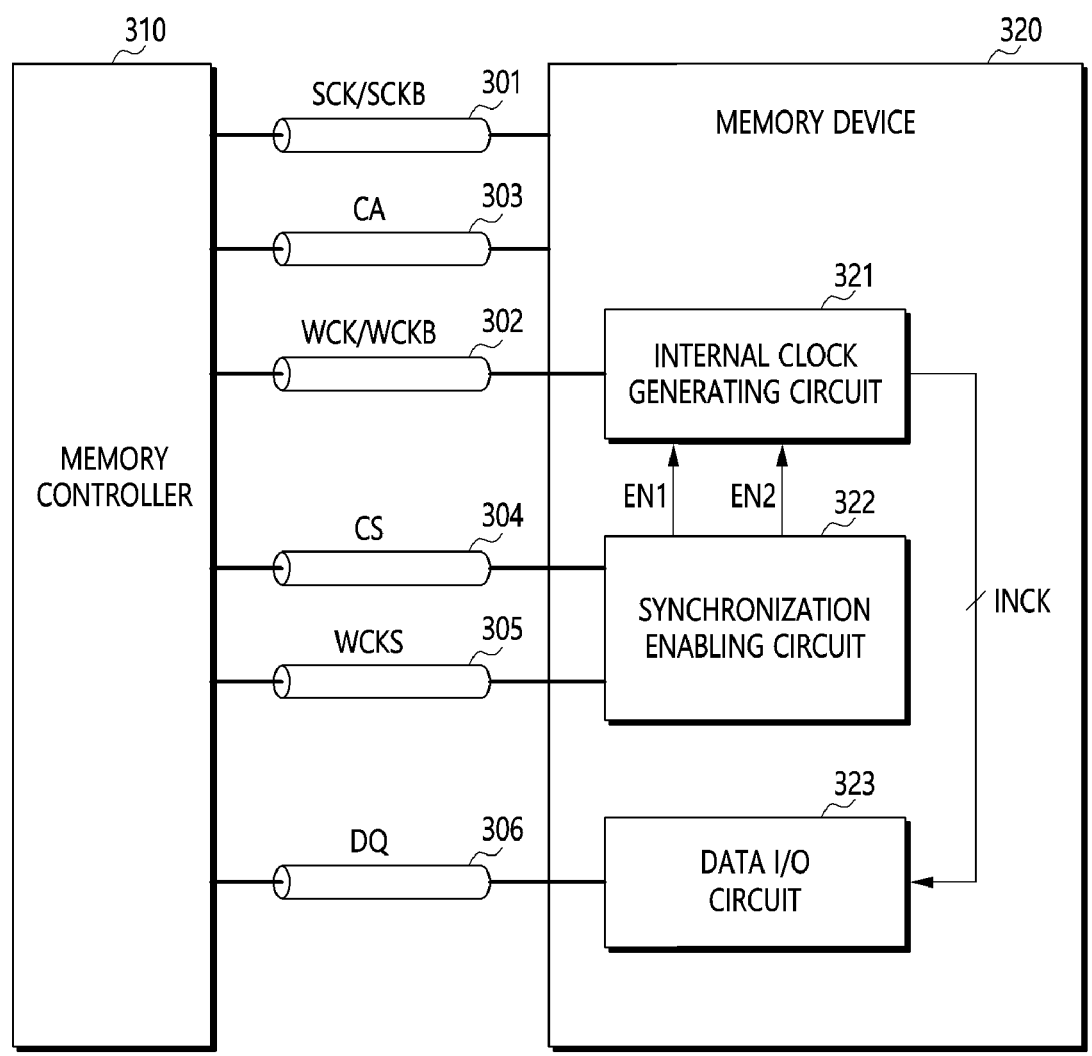
FIG. 3 is a diagram illustrating a configuration of a memory system in accordance with an embodiment.

FIG. 3 is a diagram illustrating a configuration of a memory system 300 in accordance with an embodiment. Referring to FIG. 3, the memory system 300 may include a memory controller 310 and a memory device 320. The memory controller 310 may be coupled to the memory device 320 through a system clock bus 301, a data clock bus 302, a command address bus 303, a chip selection bus 304, a data clock enable bus 305, and a data bus 306. The memory controller 310 may provide, through the system clock bus 301, the memory device 320 with system clock signals SCK and SCKB. The memory controller 310 may provide, through the data clock bus 302, the memory device 320 with data clock signals WCK and WCKB. The memory controller 310 may provide, through the command address bus 303, the memory device 320 with a command address signal CA. The memory controller 310 may provide, through the chip selection bus 104, the memory device 320 with a chip selection signal CS. The memory controller 310 may provide, through the data clock enable bus 305, the memory device 320 with a data clock enable signal WCKS. Through the data bus 306, the memory controller 310 may provide data DQ to the memory device 320 and may receive the data DQ from the memory controller 310. In an embodiment, the data clock enable bus 305 may be replaced with another signal bus that is not utilized during an access to the memory device 320. The memory controller 310 may provide the data clock enable signal WCKS to the memory device 320 through a signal bus that couples the memory controller 310 and the memory device 320 to each other but is not utilized during a current access to the memory device 320. For example, while the memory controller 310 and the memory device 320 are performing a write operation, the memory controller 310 may provide the data clock enable signal WCKS to the memory device 320 through a read strobe bus that is not utilized during the current write operation.

The memory device 320 may provide the data DQ to the memory controller 310 and may receive the data DQ from the memory controller 310, based on the system clock signals SCK and SCKB, the data clock signals WCK and WCKB, the command address signal CA, the chip selection signal CS and the data clock enable signal WCKS. The memory controller 310 may access the memory device 320 by providing the chip selection signal CS to the memory device 320. When accessed by the memory controller 310, the memory device 320 may receive the data clock signals WCK and WCKB. After accessing the memory device 320, the memory controller 310 may provide the data clock enable signal WCKS to the memory device 320. Based on the data clock enable signal WCKS, the memory device 320 may synchronize the system clock signals SCK and SCKB and the data clock signals WCK and WCKB with each other. In order for the memory device 320 to reduce a time amount required to synchronize the system clock signals SCK and SCKB and the data clock signals WCK and WCKB to each other, the memory controller 310 may define the data clock enable signal WCKS and may provide the data clock enable signal WCKS to the memory device 320. The memory controller 310 may enable the data clock enable signal WCKS at a predetermined timing. For example, the memory controller 310 may enable the data clock enable signal WCKS in a section, in which each of the system clock signal SCK and the data clock signal WCK has a low logic level. Described later will be the time-point when the data clock enable signal WCKS is enabled. Based on the data clock enable signal WCKS, the memory device 320 may synchronize the system clock signals SCK and SCKB and the data clock signals WCK and WCKB with each other. In an embodiment, the memory controller 310 may be configured to perform a memory access by providing the system clock signal SCK, the data clock signal WCK, and the chip selection signal CS, and may be configured to provide the data clock enable signal WCKS after the memory access. In an embodiment, the memory device 320 may be configured to communicate with the memory controller 310 based on the system clock signal SCK, the data clock signal WCK, the chip selection signal CS, and the data clock enable signal WCKS. The word "predetermined" as used herein with respect to a parameter, such as a predetermined timing or predetermined time amount, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The memory device 320 may include an internal clock generating circuit 321, a synchronization enabling circuit 322 and a data I/O circuit 323. The internal clock generating circuit 321 may be coupled to the data clock bus 302 and may receive the data clock signals WCK and WCKB through the data clock bus 302. The internal clock generating circuit 321 may frequency-divide the data clock signals WCK and WCKB to generate a plurality of internal clock signals INCK. The synchronization enabling circuit 322 may control whether to activate the internal clock generating circuit 321 and when to activate the internal clock generating circuit 321. The internal clock generating circuit 321 may receive a first enable signal EN1 and a second enable signal EN2. The internal clock generating circuit 321 may be partially activated on a basis of the first enable signal EN1. When partially activated, the internal clock generating circuit 321 may be fully activated on a basis of the second enable signal EN2. For example, the internal clock generating circuit 321 may receive the data clock signals WCK and WCKB when the first enable signal EN1 is enabled and may generate the plurality of internal clock signals INCK by dividing the data clock signals WCK and WCKB when the second enable signal EN2 is enabled. In an embodiment, "a circuit is partially activated" may refer that at least one element for activating the circuit is turned on or activated. And "a circuit is fully activated" may refer that all elements for activating the circuit are turned on or activated. A circuit partially activated may become fully activated faster than a circuit fully deactivated. In other words, when the circuit becomes fully activated after the circuit is partially activated, the circuit may have improved responsiveness.

The synchronization enabling circuit 322 may receive the chip selection signal CS and the data clock enable signal WCKS. The synchronization enabling circuit 322 may activate the internal clock generating circuit 321 based on the chip selection signal CS and the data clock enable signal WCKS. The synchronization enabling circuit 322 may generate the first enable signal EN1 and the second enable signal EN2 based on the chip selection signal CS and the data clock enable signal WCKS. The synchronization enabling circuit 322 may generate the first enable signal EN1 based on the chip selection signal CS and may generate the second enable signal EN2 based on the data clock enable signal WCKS. The synchronization enabling circuit 322 may enable the first enable signal EN1 when the chip selection signal CS is enabled and may enable the second enable signal EN2 when the data clock enable signal WCKS is enabled. In an embodiment, the synchronization enabling circuit 322 may activate the internal clock generating circuit 321 based on the command address signal CA and the data clock enable signal WCKS, which are provided together with the chip selection signal CS. The synchronization enabling circuit 322 may generate the first enable signal EN1 based on the command address signal CA and may generate the second enable signal EN2 based on the data clock enable signal WCKS. In an embodiment, the synchronization enabling circuit 322 may activate the internal clock generating circuit 321 based on the chip selection signal CS, the command address signal CA and the data clock enable signal WCKS. The synchronization enabling circuit 322 may generate the first enable signal EN1 based on the chip selection signal CS and the command address signal CA and may generate the second enable signal EN2 based on the data clock enable signal WCKS.

The data I/O circuit 323 may receive the plurality of internal clock signals INCK from the internal clock generating circuit 321. The data I/O circuit 323 may be coupled to the memory controller 310 through the data bus 306. In synchronization with the plurality of internal clock signals INCK, the data I/O circuit 323 may receive the data DQ from the memory controller 310 through the data bus 306. In synchronization with the plurality of internal clock signals INCK, the data I/O circuit 323 may provide the data DQ to the memory controller 310 through the data bus 306.

Figure 4:
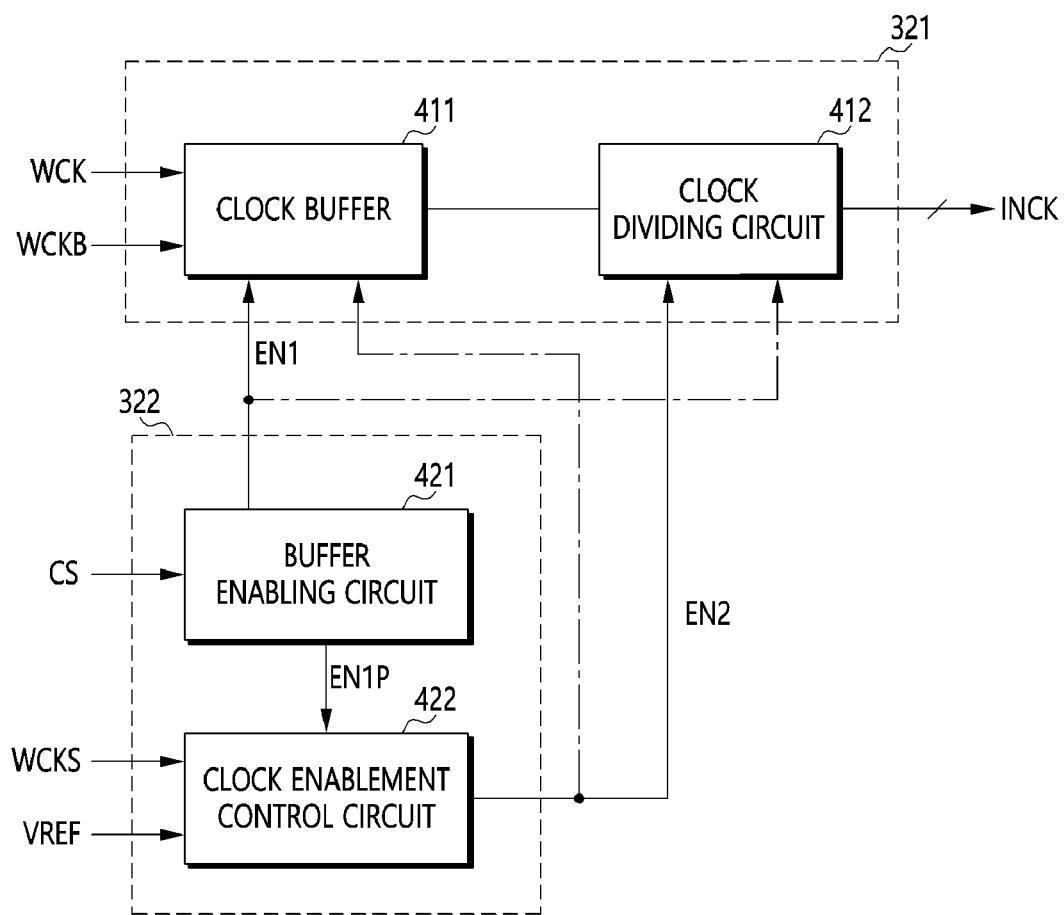
FIG. 4 is a diagram illustrating elements of an internal clock generating circuit and a synchronization enabling circuit illustrated in FIG. 3 and a connection relationship between the internal clock generating circuit and the synchronization enabling circuit.

FIG. 4 is a diagram illustrating elements of the internal clock generating circuit 321 and the synchronization enabling circuit 322 illustrated in FIG. 3 and a connection relationship between the internal clock generating circuit 321 and the synchronization enabling circuit 322. Referring to FIG. 4, the internal clock generating circuit 321 may include a clock buffer 411 and a clock dividing circuit 412. The clock buffer 411 may be coupled to the data clock bus 302 illustrated in FIG. 3 and may receive the data clock signals WCK and WCKB through the data clock bus 302. The clock buffer 411 may receive the data clock signals WCK and WCKB by differentially amplifying the data clock signal WCK and the complementary signal WCKB. The clock dividing circuit 412 may be coupled to the clock buffer 411 and may receive the data clock signals WCK and WCKB through the clock buffer 411. The clock dividing circuit 412 may generate the plurality of internal clock signals INCK by frequency-dividing the data clock signals WCK and WCKB. The clock dividing circuit 412 may generate the plurality of internal clock signals INCK by frequency-dividing, by $2n$ times, the data clock signals WCK and WCKB, 'n' being one (1) or greater as an arbitrary integer.

The synchronization enabling circuit 322 may include a buffer enabling circuit 421 and a clock enablement control circuit 422. The buffer enabling circuit 421 may be coupled to the chip selection bus 304 illustrated in FIG. 3 and may receive the chip selection signal CS through the chip selection bus 304. The buffer enabling circuit 421 may generate the first enable signal EN1 based on the chip selection signal CS. The buffer enabling circuit 421 may enable the first enable signal EN1 when the chip selection signal CS is enabled. The buffer enabling circuit 421 may keep the first enable signal enabled by latching the chip selection signal CS. The clock enablement control circuit 422 may receive the data clock enable signal WCKS. The clock enablement control circuit 422 may further receive a reference voltage VREF and may differentially amplify the data clock enable signal WCKS and the reference voltage VREF to receive the data clock enable signal WCKS. The reference voltage VREF may have a voltage level corresponding to a middle of the range, within which the data clock enable signal WCKS swings. The clock enablement control circuit 422 may generate the second enable signal EN2 based on the data clock enable signal WCKS. The clock enablement control circuit 422 may enable the second enable signal EN2 when the data clock enable signal WCKS is enabled. The clock enablement control circuit 422 may keep the second enable signal EN2 enabled by latching the data clock enable signal WCKS. In an embodiment, the clock enablement control circuit 422 may be activated on a basis of the first enable signal EN1. The clock enablement control circuit 422 may receive an enable pulse signal EN1P that is generated on a basis of the first enable signal EN1. The clock enablement control circuit 422 may be activated on a basis of the enable pulse signal EN1P. When activated on the basis of the enable pulse signal EN1P, the clock enablement control circuit 422 may generate the second enable signal EN2 from the data clock enable signal WCKS. The buffer enabling circuit 421 may further generate the enable pulse signal EN1P based on the first enable signal EN1. The buffer enabling circuit 421 may generate the enable pulse signal EN1P that is enabled when the first enable signal EN1 is enabled and that stays enabled for a predetermined time amount.

The clock buffer 411 may receive the first enable signal EN1 and the clock dividing circuit 412 may receive the second enable signal EN2. The clock buffer 411 may be activated on the basis of the first enable signal EN1. When the first enable signal EN1 is enabled, the clock buffer 411 may be activated to receive the data clock signals WCK and WCKB. When the first enable signal EN1 is enabled, the clock dividing circuit 412 may receive the data clock signals WCK and WCKB through the clock buffer 411 but might not perform the dividing operation not to generate the plurality of internal clock signals INCK. The clock dividing circuit 412 may be activated on the basis of the second enable signal EN2. When the second enable signal EN2 is enabled, the clock dividing circuit 412 may be activated to divide the data clock signals WCK and WCKB thereby generating the plurality of internal clock signals INCK. In an embodiment, the clock buffer 411 may receive both the first enable signal EN1 and the second enable signal EN2. The clock buffer 411 may be partially activated on the basis of the first enable signal EN1 and may be fully activated on the basis of the second enable signal EN2. For example, the clock buffer 411 may include a plurality of differential amplifying stages. A part of the plurality of differential amplifying stages may be activated on the basis of the first enable signal EN1. Remaining part or parts of the plurality of differential amplifying stages may be activated on the basis of the second enable signal EN2. In an embodiment, the clock dividing circuit 412 may receive both the first enable signal EN1 and the second enable signal EN2. The clock dividing circuit 412 may be partially activated on the basis of the first enable signal EN1 and may be fully activated on the basis of the second enable signal EN2. For example, the clock dividing circuit 412 may include a buffer configured to buffer the data clock signals WCK and WCKB and a divider configured to divide the buffered signals. The buffer may be activated on the basis of the first enable signal EN1 and the divider may be activated on the basis of the second enable signal EN2.

Figure 5:
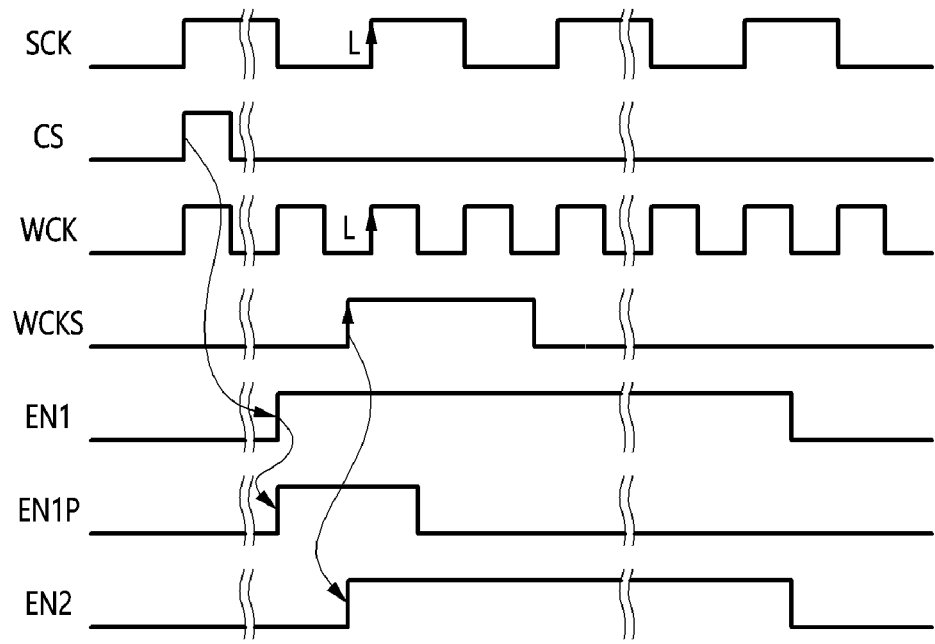
FIG. 5 is a timing diagram illustrating an operation of a memory system in accordance with an embodiment.

FIG. 5 is a timing diagram illustrating an operation of the memory system 300 in accordance with an embodiment. Described hereinafter with reference to FIGS. 3 to 5 is the operation of the memory system 300. The memory controller 310 may provide the memory device 320 with the chip selection signal CS for the memory access. The buffer enabling circuit 421 may generate the first enable signal EN1 based on the chip selection signal CS. The buffer enabling circuit 421 may generate the enable pulse signal EN1P based on the first enable signal EN1. When the first enable signal EN1 becomes enabled, the clock buffer 411 may become activate to receive the data clock signals WCK and WCKB provided through the data clock bus 302. The clock enablement control circuit 422 may become activated on the basis of the enable pulse signal EN1P. After the memory access, the memory controller 310 may provide the data clock enable signal WCKS to the memory device 320. The clock enablement control circuit 422 may enable the second enable signal EN2 based on the data clock enable signal WCKS. When the second enable signal EN2 becomes enabled, the clock dividing circuit 412 may become activated to divide the data clock signals WCK and WCKB thereby generating the plurality of internal clock signals INCK. The memory controller 310 may enable the data clock enable signal WCKS when both the system clock signal SCK and the data clock signal WCK have a low logic level L. The clock dividing circuit 412 becomes activated when the data clock enable signal WCKS becomes enabled. Therefore, the dividing operation of the clock dividing circuit 412 and the plurality of internal clock signals INCK may become synchronized with a rising edge of the data clock signal WCK, which is generated after the data clock enable signal WCKS becomes enabled. The rising edge of the data clock signal WCK may be synchronized with a rising edge of the system clock signal SCK. Therefore, the rising edges of the system clock signal SCK, the data clock signal WCK and the plurality of internal clock signals INCK may be synchronized with one another. In an embodiment, the memory controller 310 may provide the memory device 320 with the data clock enable signal WCKS and therefore the memory device 320 may promptly synchronize the system clock signal SCK, the data clock signal WCK and the plurality of internal clock signals INCK with one another. Accordingly, in an embodiment, the static section Ts and the half-rate section Th illustrated in FIG. 2 will not be required anymore, which improves the performance of the memory system 300.

Figure 6:
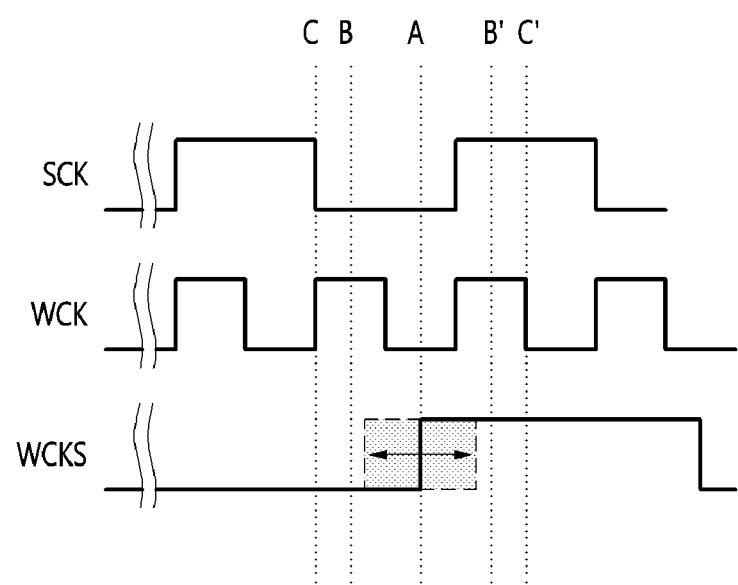
FIG. 6 is a timing diagram illustrating an enabled section of a data clock enable signal in accordance with an embodiment.

FIG. 6 is a timing diagram illustrating an enabled section of the data clock enable signal WCKS in accordance with an embodiment. Referring to FIG. 6, when both the system clock signal SCK and the data clock signal WCK have a low logic level, the data clock enable signal WCKS may be preferable to become enabled at the middle time-point 'A' within the low logic level section of the data clock signal WCK. When the system clock signal SCK has a low logic level, the data clock enable signal WCKS may become enabled at any time-point while the data clock signal WCK is having a low logic level. When the system clock signal SCK has a low logic level, the data clock signal WCK may have a high logic level and 'B' may be a middle time-point within a section, in which the data clock signal WCK is having a high logic level. "B" may be a middle time-point within a section, in which the data clock signal WCK is having a high logic level, when both the system clock signal SCK and the data clock signal WCK have a high logic level. The time-points 'B' and 'B" may be boundaries discriminating between the stable state and the meta-stable state. There may be a delay time amount from when the clock enablement control circuit 422 receives the data clock enable signal WCKS and generates second enable signal EN2 to when the clock dividing circuit 412 divides the data clock signals WCK and WCKB. When considering the delay time amount, the memory device 320 can synchronize the system clock signal SCK and the data clock signal WCK with each other so far as the data clock enable signal WCKS becomes enabled between the time-points 'B' and 'B". However, when the data clock enable signal WCKS becomes enabled out of the section defined by the time-points 'B' and 'B", the plurality of internal clock signals INCK generated from the clock dividing circuit 412 may become in the meta-stable state, in which the plurality of internal clock signals INCK can be or cannot be synchronized with the system clock signal SCK. 'C' may be a time-point when the system clock signal SCK transitions from a high logic level to a low logic level and the data clock signal WCK transitions from a low logic level to a high logic level. 'C" may be a time-point when the system clock signal SCK has a high logic level and the data clock signal WCK transitions from a high logic level to a low logic level. The time-points 'C' and 'C'' may be boundaries discriminating between the meta-stable state and the fail state. When the data clock enable signal WCKS becomes enabled out of the section defined by the time-points 'C' and 'C'', the plurality of internal clock signals INCK generated from the clock dividing circuit 412 might not be synchronized with the system clock signal SCK. The memory controller 310 may enable the data clock enable signal WCKS within the section defined by the time-points 'B' and 'B''. The maximum section that the data clock enable signal WCKS can become enabled may be the section from a time-point when 0.5 times a unit interval (UI) and/or half of the UI elapses after the system clock signal SCK transitions to a low logic level to a time-point when 0.5 times the UI and/or half of the UI elapses after the system clock signal SCK transitions to a high logic level. One (1) UI may correspond to a half-period of the data clock signal WCK. The memory controller 310 illustrated in FIG. 3 may variously change, according to a type and a characteristic of the memory device 320, the time-point when the data clock enable signal WCKS becomes enabled. For example, the memory controller 310 may perform a training operation with the memory device 320 to determine the optimum time-point when the data clock enable signal WCKS becomes enabled.

Figure 7:
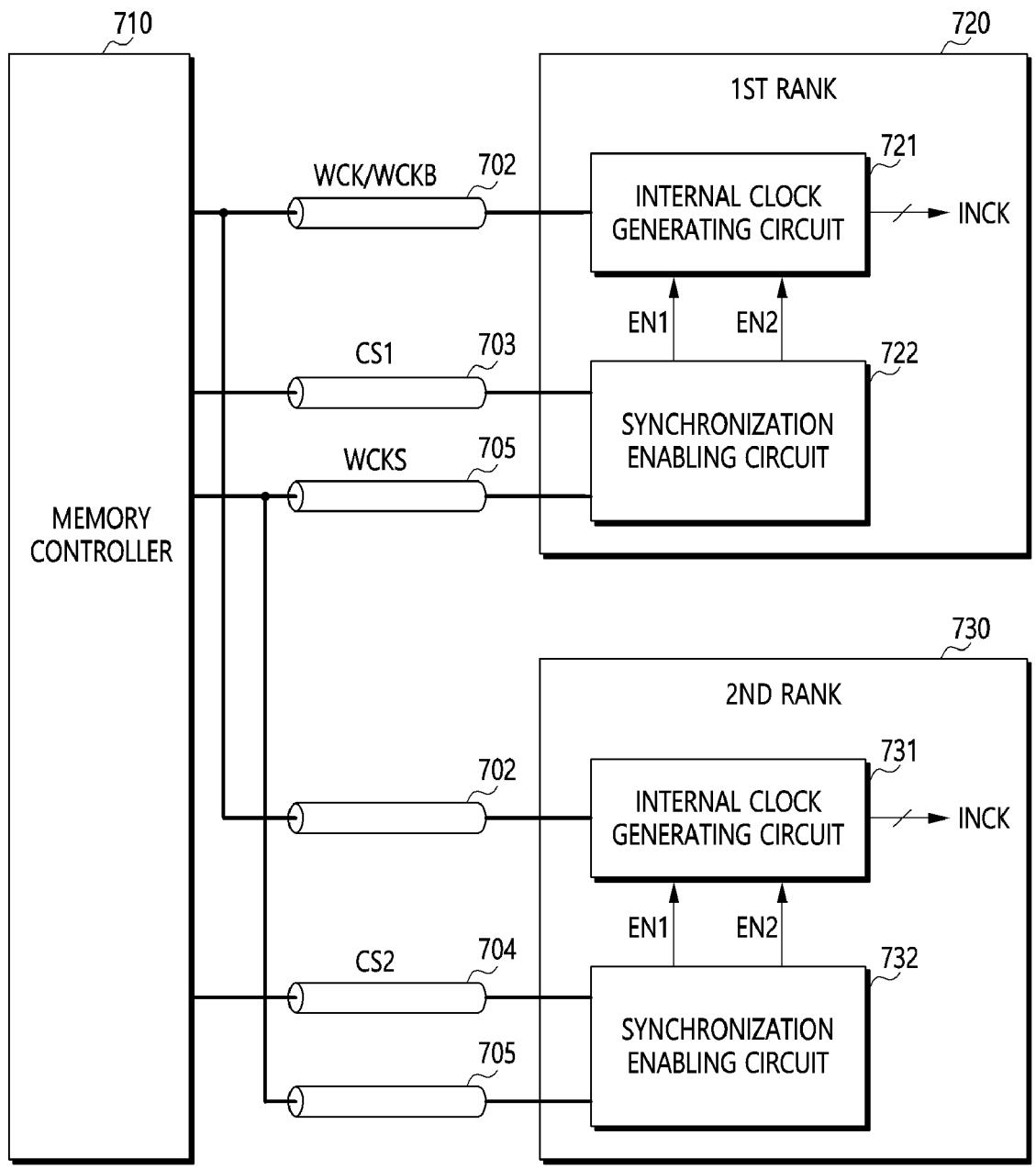
FIG. 7 is a diagram illustrating a configuration of a memory system in accordance with an embodiment.

FIG. 7 is a diagram illustrating a configuration of a memory system 700 in accordance with an embodiment. FIG. 7 illustrates only essential elements that can show the technical features of an embodiment and the memory system 700 may further include other signal buses and other internal circuits, as illustrated in FIG. 2. Referring to FIG. 7, the memory system 700 may include a memory controller 710, a first rank 720 and a second rank 730. The first rank 720 may include a first memory device and the second rank 730 may include a second memory device. The memory controller 710 may be coupled to the first rank 720 and the second rank 730 through a data clock bus 702, a first chip selection bus 703, a second chip selection bus 704 and a data clock enable bus 705. The first rank 720 may be coupled to the memory controller 710 through the data clock bus 702, the first chip selection bus 703 and the data clock enable bus 705. The second rank 730 may be coupled to the memory controller 710 through the data clock bus 702, the second chip selection bus 704 and the data clock enable bus 705. The memory controller 710 may provide data clock signals WCK and WCKB to the first rank 720 and the second rank 730 through the data clock bus 702. The memory controller 710 may provide a data clock enable signal WCKS to the first rank 720 and the second rank 730 through the data clock enable bus 705. The memory controller 710 may provide a first chip selection signal CS1 to the first rank 720 through the first chip selection bus 703. The memory controller 710 may provide a second chip selection signal CS2 to the second rank 730 through the second chip selection bus 704. The memory controller 710 may provide the first chip selection signal CS1 to the first rank 720 for the access to the first rank 720. The memory controller 710 may provide the second chip selection signal CS2 to the second rank 730 for the access to the second rank 730.

The memory controller 710 may provide the first chip selection signal CS1 to access the first rank 720. After the first rank 720 is accessed, the memory controller 710 may provide the data clock enable signal WCKS to the first rank 720. Because the second rank 730 is not yet accessed by the memory controller 710, the second rank 730 might not yet receive the data clock enable signal WCKS even when the data clock enable signal WCKS is provided from the memory controller 710. Based on the data clock enable signal WCKS, the first rank 720 may synchronize the system clock signal and the data clock signal WCK with each other. The first rank 720 may generate a plurality of internal clock signals INCK from the data clock signal WCK. Based on the data clock enable signal WCKS, the first rank 720 may generate the plurality of internal clock signals INCK to synchronize the system clock signal SCK, the data clock signal WCK, and the plurality of internal clock signals INCK with one another.

The memory controller 710 may provide the second chip selection signal CS2 to access the second rank 730. After the second rank 730 is accessed, the memory controller 710 may provide the data clock enable signal WCKS to the second rank 730. Because the first rank 720 is not yet accessed by the memory controller 710, the first rank 720 might not yet receive the data clock enable signal WCKS even when the data clock enable signal WCKS is provided from the memory controller 710. Based on the data clock enable signal WCKS, the second rank 730 may synchronize the system clock signal and the data clock signal WCK with each other. The second rank 730 may generate a plurality of internal clock signals INCK from the data clock signal WCK. Based on the data clock enable signal WCKS, the second rank 730 may generate the plurality of internal clock signals INCK to synchronize the system clock signal, the data clock signal WCK, and the plurality of internal clock signals INCK with one another.

The memory controller 710 may enable the data clock enable signal WCKS after the memory controller 710 provides one of the first chip selection signal CS1 and the second chip selection signal CS2 to perform a first access to one of the first rank 720 and the second rank 730. Then, the memory controller 710 may disable the data clock enable signal WCKS before the memory controller 710 provides one of the first chip selection signal CS1 and the second chip selection signal CS2 to perform a second access to one of the first rank 720 and the second rank 730. In an embodiment, the memory controller 710 may disable the data clock enable signal WCKS at the same time when performing the second access. In an embodiment, the memory controller 710 may control the data clock enable signal WCKS to transition from a low logic level to a high logic level after the memory controller 710 provides one of the first chip selection signal CS1 and the second chip selection signal CS2 to perform a first access to one of the first rank 720 and the second rank 730. Then, the memory controller 710 may control the data clock enable signal WCKS to transition from a high logic level to a low logic level when the memory controller 710 provides the other one of the first chip selection signal CS1 and the second chip selection signal CS2 to perform a second access. The one of the first rank 720 and the second rank 730 may synchronize the system clock signals and the data clock signals WCK and WCKB with each other in synchronization with a rising edge of the data clock enable signal WCKS. The other one of the first rank 720 and the second rank 730 may synchronize the system clock signals and the data clock signals WCK and WCKB with each other in synchronization with a falling edge of the data clock enable signal WCKS. In the embodiment, when the memory controller 710 performs the first access to the first rank 720 and then performs the second access again to the first rank 720, the memory controller 710 may control the data clock enable signal WCKS to transition from a high logic level to a low logic level before the second access or at the same time of the second access after the first access.

The first rank 720 may include at least an internal clock generating circuit 721 and a synchronization enabling circuit 722. The internal clock generating circuit 721 may receive the data clock signals WCK and WCKB from the memory controller 710. Based on the data clock signals WCK and WCKB, the internal clock generating circuit 721 may generate the plurality of internal clock signals INCK. The synchronization enabling circuit 722 may receive the first chip selection signal CS1 and the data clock enable signal WCKS. The synchronization enabling circuit 722 may generate a first enable signal EN1 and a second enable signal EN2 based on the first chip selection signal CS1 and the data clock enable signal WCKS. When activated on the basis of the first enable signal EN1 and the second enable signal EN2, the internal clock generating circuit 721 may generate the plurality of internal clock signals INCK from the data clock signals WCK and WCKB. The internal clock generating circuit 721 and the synchronization enabling circuit 722 may have substantially the same configurations and may perform substantially the same operations respectively as the internal clock generating circuit 321 and the synchronization enabling circuit 322 illustrated in FIG. 4.

The second rank 730 may include at least an internal clock generating circuit 731 and a synchronization enabling circuit 732. The internal clock generating circuit 731 may receive the data clock signals WCK and WCKB from the memory controller 710. Based on the data clock signals WCK and WCKB, the internal clock generating circuit 731 may generate the plurality of internal clock signals INCK. The synchronization enabling circuit 732 may receive the second chip selection signal CS2 and the data clock enable signal WCKS. The synchronization enabling circuit 732 may generate a first enable signal EN1 and a second enable signal EN2 based on the second chip selection signal CS2 and the data clock enable signal WCKS. When activated on the basis of the first enable signal EN1 and the second enable signal EN2, the internal clock generating circuit 731 may generate the plurality of internal clock signals INCK from the data clock signals WCK and WCKB. The internal clock generating circuit 731 and the synchronization enabling circuit 732 may have substantially the same configurations and may perform substantially the same operations respectively as the internal clock generating circuit 321 and the synchronization enabling circuit 322 illustrated in FIG. 4.

Figure 8:
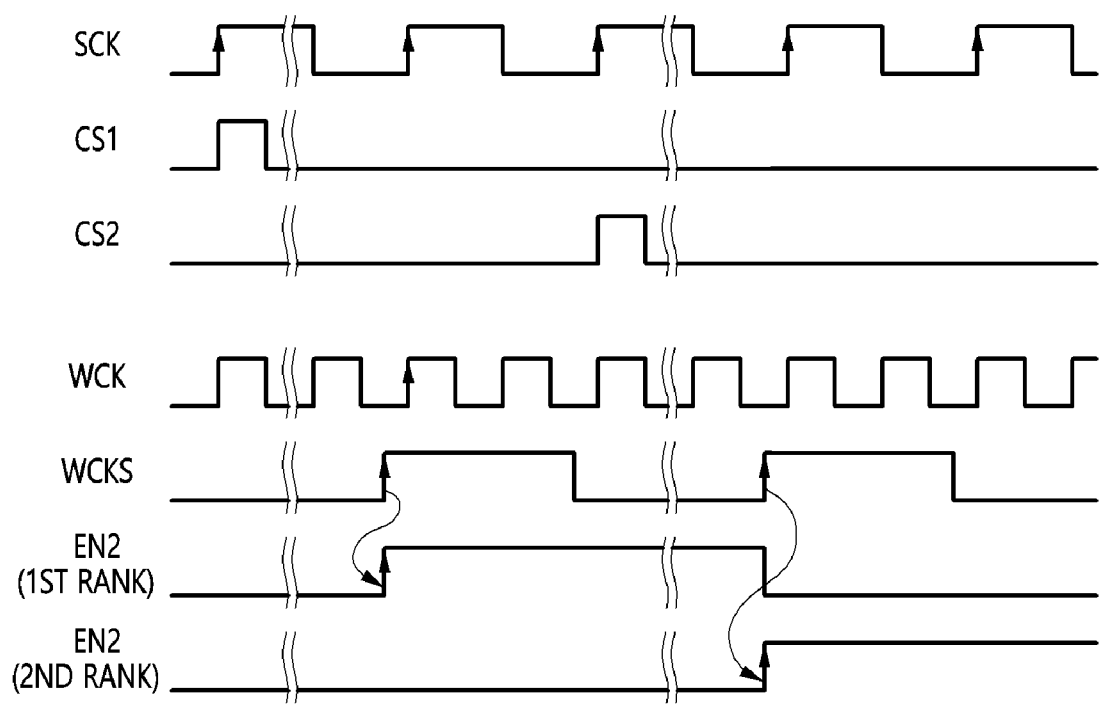
FIG. 8 is a timing diagram illustrating an operation of the memory system illustrated in FIG. 7.

FIG. 8 is a timing diagram illustrating an operation of the memory system 700 illustrated in FIG. 7. Described hereinafter with reference to FIGS. 7 and 8 is the operation of the memory system 700. The memory controller 710 may provide the first rank 720 with the first chip selection signal CS1 to access the first rank 720. Based on the first chip selection signal CS1, the synchronization enabling circuit 722 of the first rank 720 may enable a first enable signal EN1. When the first enable signal EN1 becomes enabled, the internal clock generating circuit 721 of the first rank 720 may receive the data clock signals WCK and WCKB. After accessing the first rank 720, the memory controller 710 may enable the data clock enable signal WCKS. Based on the data clock enable signal WCKS, the synchronization enabling circuit 722 of the first rank 720 may enable the second enable signal EN2 (first rank). When the second enable signal EN2 (first rank) becomes enabled, the internal clock generating circuit 721 of the first rank 720 may generate the plurality of internal clock signals INCK from the data clock signals WCK and WCKB. Therefore, the system clock signal SCK, the data clock signal WCK and the plurality of internal clock signals INCK may be synchronized with one another. While accessing the first rank 720, the memory controller 710 may provide the second chip selection signal CS2 to access the second rank 730. Before providing the second chip selection signal CS2, the memory controller 710 may disable the data clock enable signal WCKS. The memory controller 710 may disable the data clock enable signal WCKS at any time-point before providing the second chip selection signal CS2. The memory controller 710 may disable, before a second access, the data clock enable signal WCKS that is enabled after a first access. Based on the second chip selection signal CS2, the synchronization enabling circuit 732 of the second rank 730 may enable a first enable signal EN1. When the first enable signal EN1 becomes enabled, the internal clock generating circuit 731 of the second rank 730 may receive the data clock signals WCK and WCKB. After accessing the second rank 730, the memory controller 710 may enable the data clock enable signal WCKS. Based on the data clock enable signal WCKS, the synchronization enabling circuit 732 of the second rank 730 may enable the second enable signal EN2 (second rank). When the second enable signal EN2 (second rank) becomes enabled, the internal clock generating circuit 731 of the second rank 730 may generate the plurality of internal clock signals INCK from the data clock signals WCK and WCKB. Therefore, the system clock signal SCK, the data clock signal WCK and the plurality of internal clock signals INCK may be synchronized with one another. The memory controller 710 may disable the data clock enable signal WCKS before performing a subsequent access.

Figure 9:
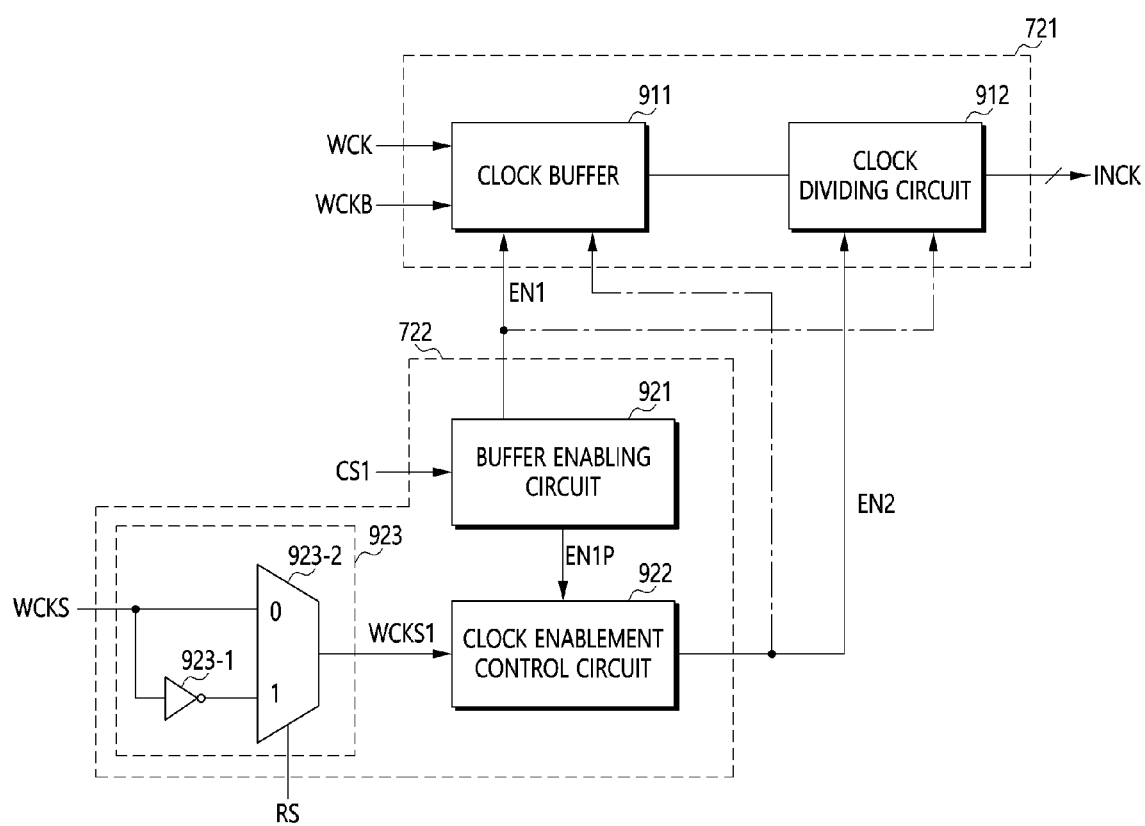
FIG. 9 is a diagram illustrating elements of an internal clock generating circuit and a synchronization enabling circuit within a first rank illustrated in FIG. 7 and a connection relationship between the internal clock generating circuit and the synchronization enabling circuit.

FIG. 9 is a diagram illustrating elements of the internal clock generating circuit 721 and the synchronization enabling circuit 722 within the first rank 720 illustrated in FIG. 7 and a connection relationship between the internal clock generating circuit 721 and the synchronization enabling circuit 722. Referring to FIG. 9, the internal clock generating circuit 721 may include a clock buffer 911 and a clock dividing circuit 912. The clock buffer 911 may receive the data clock signals WCK and WCKB. The clock dividing circuit 912 may generate the plurality of internal clock signals INCK by frequency-dividing the data clock signals WCK and WCKB provided through the clock buffer 911. The clock buffer 911 and the clock dividing circuit 912 may perform substantially the same operations respectively as the clock buffer 411 and the clock dividing circuit 412 illustrated in FIG. 4.

The synchronization enabling circuit 722 may include a buffer enabling circuit 921, a clock enablement control circuit 922 and a level determining circuit 923. The buffer enabling circuit 921 may receive the first chip selection signal CS1 to generate a first enable signal EN1 and an enable pulse signal EN1P. The buffer enabling circuit 921 may perform substantially the same operation as the buffer enabling circuit 421 illustrated in FIG. 4. The clock enablement control circuit 922 may receive a first internal data clock enable signal WCKS1. The clock enablement control circuit 922 may generate the second enable signal EN2 based on the first internal data clock enable signal WCKS1. The clock enablement control circuit 922 may perform substantially the same operation as the clock enablement control circuit 422 illustrated in FIG. 4 except that the clock enablement control circuit 922 receives the first internal data clock enable signal WCKS1 instead of the data clock enable signal WCKS. The level determining circuit 923 may receive the data clock enable signal WCKS to generate the first internal data clock enable signal WCKS1. The level determining circuit 923 may change the logic level of the first internal data clock enable signal WCKS1 according to turns of ranks each including the level determining circuit 923. The level determining circuit 923 may output, as the first internal data clock enable signal WCKS1, one of non-inverted and inverted signals of the data clock enable signal WCKS based on a rank information signal RS. The rank information signal RS may be for identifying the ranks. For example, the rank information signal RS of the first rank 720 may have a low logic level and the rank information signal RS of the second rank 730 may have a high logic level. The rank information signal RS may be provided from the memory controller 710. The logic level of the rank information signal RS may be fixed when the first rank 720 and the second rank 730 are mounted to the memory controller 710. For example, the rank information signal RS may include a test mode signal, a fuse signal or a wire-bonding signal. Based on the rank information signal RS, the level determining circuit 923 may output the first internal data clock enable signal WCKS1 having the same logic level as the data clock enable signal WCKS. The internal clock generating circuit 731 and the synchronization enabling circuit 732 of the second rank 730 illustrated in FIG. 7 may have substantially the same configurations and may perform substantially the same operations respectively as the internal clock generating circuit 721 and the synchronization enabling circuit 722 illustrated in FIG. 9 except that the synchronization enabling circuit 732 receives the second chip selection signal CS2 instead of the first chip selection signal CS1. The level determining circuit within the synchronization enabling circuit 732 of the second rank 730 may receive the rank information signal RS having a high logic level to generate a second internal data clock enable signal having an opposite logic level to the data clock enable signal WCKS.

The level determining circuit 923 may include an inverter 923-1 and a multiplexer 923-2. The inverter 923-1 may receive the data clock enable signal WCKS to inversion-drive the data clock enable signal WCKS. The multiplexer 923-2 may receive the data clock enable signal WCKS and an output signal from the inverter 923-1 and may receive, as a control signal, the rank information signal RS. Based on the rank information signal RS, the multiplexer 923-2 may output, as the first internal data clock enable signal WCKS1, one of the data clock enable signal WCKS and the inverted data clock enable signal WCKS, which is output from the inverter 923-1. When the rank information signal RS has a low logic level, the multiplexer 923-2 may output the data clock enable signal WCKS as the first internal data clock enable signal WCKS1. A multiplexer provided within the level determining circuit of the second rank 730 may output, as the second internal data clock enable signal, the inverted data clock enable signal WCKS based on the rank information signal RS having a high logic level.

Figure 10:
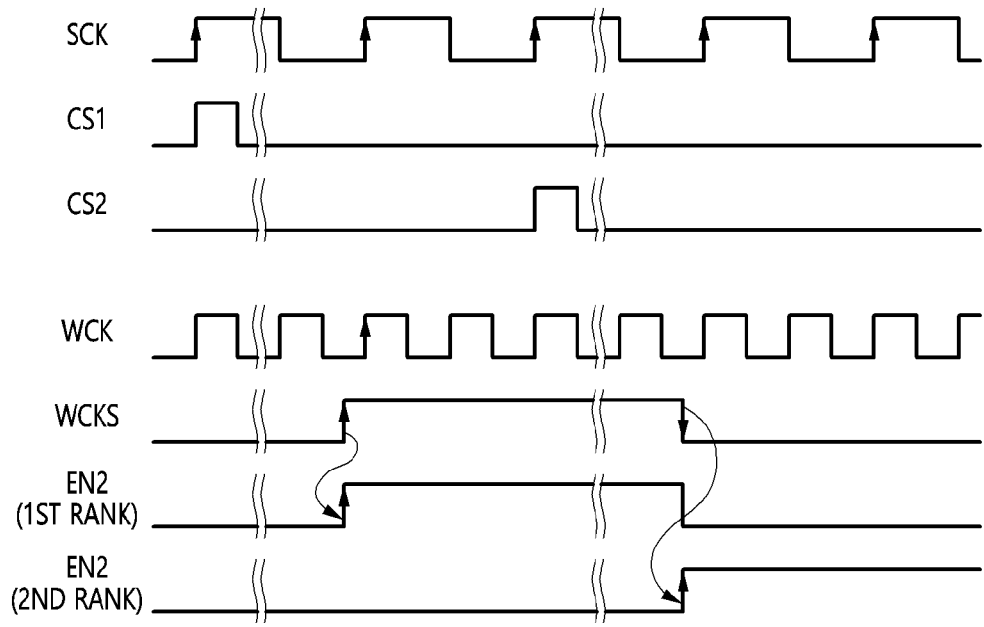
FIG. 10 is a timing diagram illustrating an operation of a memory system in accordance with an embodiment.

FIG. 10 is a timing diagram illustrating an operation of the memory system 700 in accordance with an embodiment. FIG. 10 illustrates the operation of the memory system 700 when each of the first rank 720 and the second rank 730 includes the configurations of the internal clock generating circuit 721 and the synchronization enabling circuit 722 illustrated in FIG. 9. Described hereinafter with reference to FIGS. 7, 9 and 10 is the operation of the memory system 700. The memory controller 710 may provide the first chip selection signal CS1 to access the first rank 720. The buffer enabling circuit 921 within the first rank 720 may enable the first enable signal EN1 based on the first chip selection signal CS1. When the first enable signal EN1 becomes enabled, the clock buffer 911 within the first rank 720 may receive the data clock signals WCK and WCKB. After accessing the first rank 720, the memory controller 710 may control the data clock enable signal WCKS to transition from a low logic level to a high logic level. The level determining circuit 923 within the first rank 720 may output the first internal data clock enable signal WCKS1 having the same level as the data clock enable signal WCKS. The clock enablement control circuit 922 within the first rank 720 may enable the second enable signal EN2 (first rank) based on the first internal data clock enable signal WCKS1. When the second enable signal EN2 (first rank) is enabled, the clock dividing circuit 912 within the first rank 720 may generate the plurality of internal clock signals INCK from the data clock signals WCK and WCKB. Therefore, the system clock signal SCK, the data clock signal WCK and the plurality of internal clock signals INCK may be synchronized with one another. While accessing the first rank 720, the memory controller 710 may provide the second chip selection signal CS2 to access the second rank 730. After accessing the second rank 730, the memory controller 710 may control the data clock enable signal WCKS to transition from a high logic level to a low logic level. The level determining circuit within the second rank 730 may generate the second internal data clock enable signal having an opposite logic level to the data clock enable signal WCKS and the second internal data clock enable signal may transition from a low logic level to a high logic level. The synchronization enabling circuit 732 within the second rank 730 may enable the second enable signal EN2 (second rank) based on the second internal data clock enable signal. When the second enable signal EN2 (second rank) is enabled, the internal clock generating circuit 731 within the second rank 730 may generate the plurality of internal clock signals INCK from the data clock signal WCK. Therefore, the system clock signal SCK, the data clock signal WCK, and the plurality of internal clock signals INCK may be synchronized with one another. The memory controller 710 may control the data clock enable signal WCKS to transition from a low logic level to a high logic level after a first access and may control the data clock enable signal WCKS to transition from a high logic level to a low logic level after a second access. The memory controller 710 might not need to disable the data clock enable signal WCKS after an access to one of the first rank 720 and the second rank 730 until an access to the other one of the first rank 720 and the second rank 730. In an embodiment, when utilizing the data clock enable signal WCKS as a level signal for the first rank 720 and the second rank 730, the memory controller 710 may easily control the state of the data clock enable signal WCKS.

Figure 11:
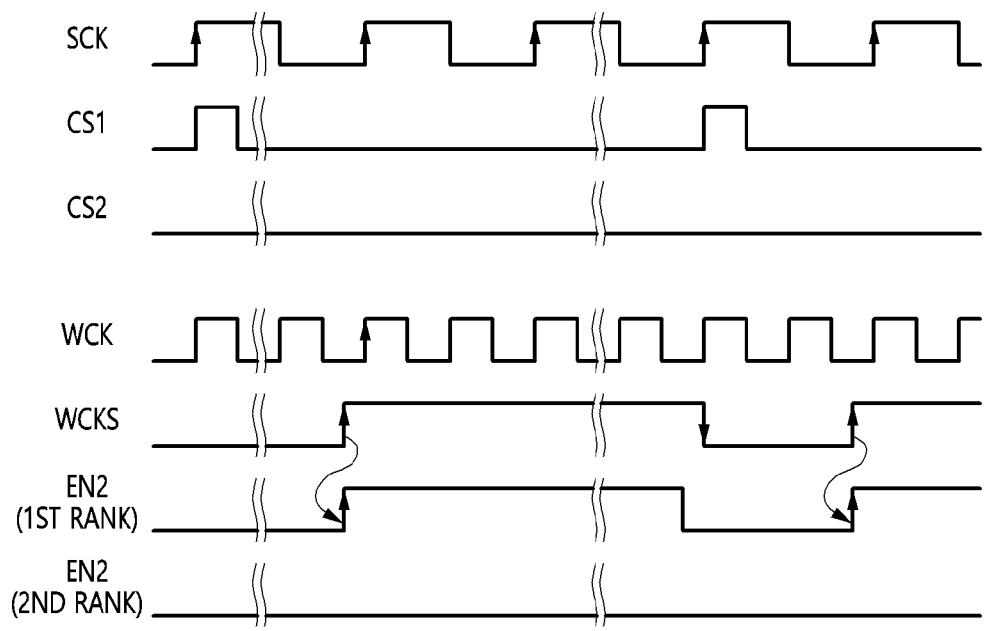
FIG. 11 is a timing diagram illustrating an operation of a memory system in accordance with an embodiment.

FIG. 11 is a timing diagram illustrating an operation of a memory system in accordance with an embodiment. FIG. 11 illustrates the operation of the memory system 700 when each of the first rank 720 and the second rank 730 includes the configurations of the internal clock generating circuit 721 and the synchronization enabling circuit 722 illustrated in FIG. 9 and when the memory controller 710 accesses the first rank 720 at a first access and then accesses again the first rank 720 at a second access subsequent to the first access. The memory controller 710 may provide the first chip selection signal CS1 to access the first rank 720. After accessing the first rank 720, the memory controller 710 may control the data clock enable signal WCKS to transition from a low logic level to a high logic level. The first rank 720 may enable the second enable signal EN2 (first rank) based on the data clock enable signal WCKS and may synchronize the system clock signal SCK, the data clock signal WCK and the plurality of internal clock signals INCK may be synchronized with one another. In order for the memory controller 710 to access again the first rank 720 by providing again the first chip selection signal CS1, the memory controller 710 may control the data clock enable signal WCKS to transition from a high logic level to a low logic level before or simultaneously when providing again the first chip selection signal CS1. After accessing again the first rank 720, the memory controller 710 may control the data clock enable signal WCKS to transition again from a low logic level to a high logic level and the first rank 720 may enable the second enable signal EN2 (first rank) based on the data clock enable signal WCKS and may synchronize the system clock signal SCK and the data clock signal WCK with each other. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

Figure 12:
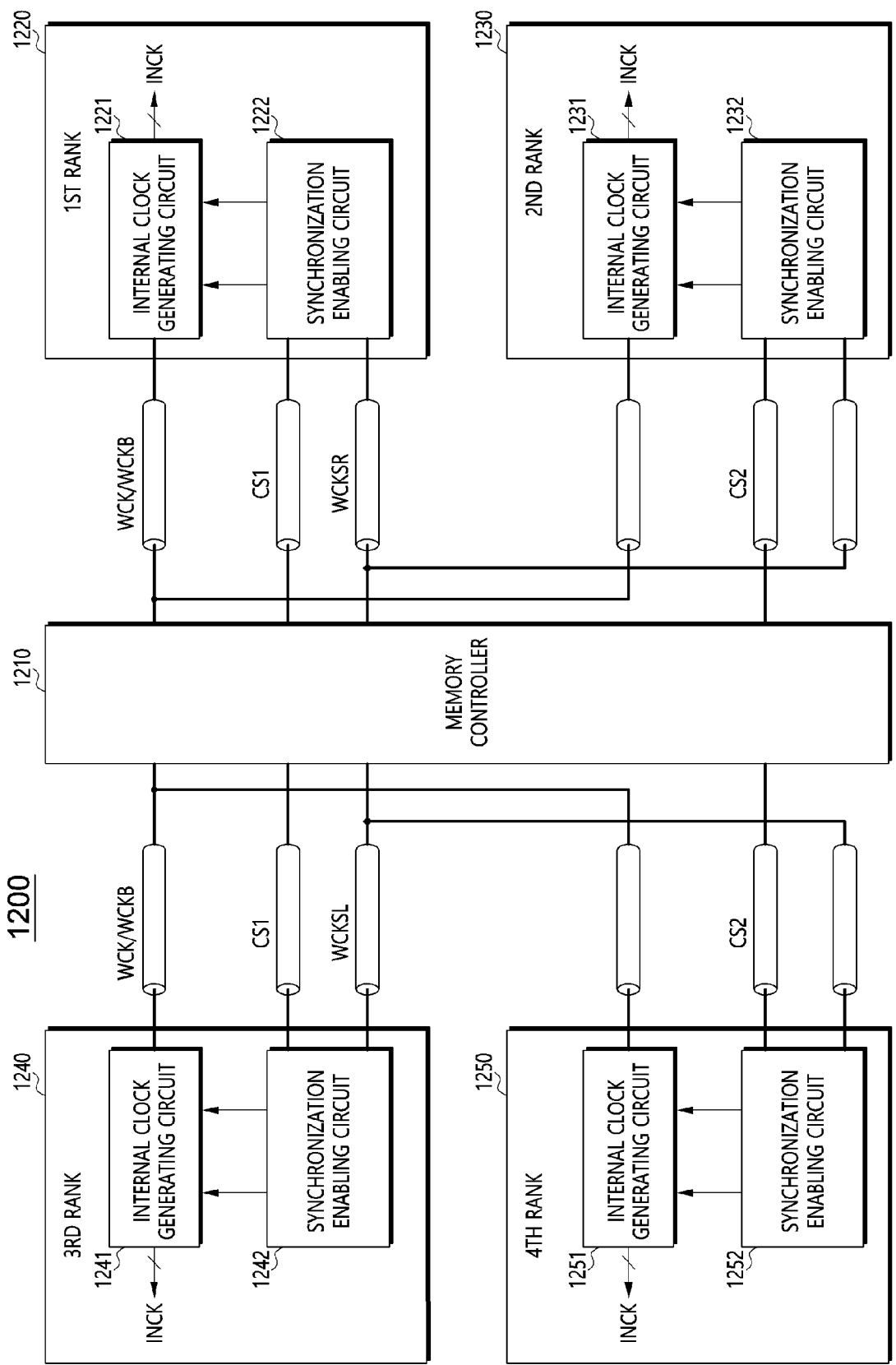
FIG. 12 is a diagram illustrating a configuration of a memory system in accordance with an embodiment.

FIG. 12 is a diagram illustrating a configuration of a memory system 1200 in accordance with an embodiment. Referring to FIG. 12, the memory system 1200 may include a memory controller 1210, a first rank 1220, a second rank 1230, a third rank 1240 and a fourth rank 1250. The first rank 1220 and the second rank 1230 may be right-sided ranks and may be provided in the right side of the memory controller 1210. The third rank 1240 and the fourth rank 1250 may be left-sided ranks and may be provided in the left side of the memory controller 1210. However, the locations of the ranks will not be limited thereto and may variously change. The memory controller 1210 may provide data clock signals WCK and WCKB, a first chip selection signal CS1, a second chip selection signal CS2, a first data clock enable signal WCKSR, and a second data clock enable signal WCKSL to access the first rank 1220, the second rank 1230, the third rank 1240 and the fourth rank 1250. The memory controller 1210 may provide the data clock signals WCK and WCKB commonly to the first to fourth ranks 1220, 1230, 1240 and 1250. The memory controller 1210 may provide the first rank 1220 and the third rank 1240 with the first chip selection signal CS1 and may provide the second rank 1230 and the fourth rank 1250 with the second chip selection signal CS2. The memory controller 1210 may provide the first rank 1220 and the second rank 1230 with the first data clock enable signal WCKSR and may provide the third rank 1240 and the fourth rank 1250 with the second data clock enable signal WCKSL.

The first rank 1220 may communicate with the memory controller 1210 based on the data clock signals WCK and WCKB, the first chip selection signal CS1 and the first data clock enable signal WCKSR. The second rank 1230 may communicate with the memory controller 1210 based on the data clock signals WCK and WCKB, the second chip selection signal CS2 and the first data clock enable signal WCKSR. The third rank 1240 may communicate with the memory controller 1210 based on the data clock signals WCK and WCKB, the first chip selection signal CS1 and the second data clock enable signal WCKSL. The fourth rank 1250 may communicate with the memory controller 1210 based on the data clock signals WCK and WCKB, the second chip selection signal CS2 and the second data clock enable signal WCKSL.

After accessing the first rank 1220 by providing the first chip selection signal CS1 to the first rank 1220, the memory controller 1210 may provide the first data clock enable signal WCKSR to the first rank 1220. Based on the first data clock enable signal WCKSR, the first rank 1220 may synchronize a system clock signal and the data clock signals WCK and WCKB with each other. After accessing the second rank 1230 by providing the second chip selection signal CS2 to the second rank 1230, the memory controller 1210 may provide the first data clock enable signal WCKSR to the second rank 1230. Based on the first data clock enable signal WCKSR, the second rank 1230 may synchronize the system clock signal and the data clock signals WCK and WCKB with each other. After accessing the third rank 1240 by providing the first chip selection signal CS1 to the third rank 1240, the memory controller 1210 may provide the second data clock enable signal WCKSL to the third rank 1240. Based on the second data clock enable signal WCKSL, the third rank 1240 may synchronize the system clock signal and the data clock signals WCK and WCKB with each other. After accessing the fourth rank 1250 by providing the second chip selection signal CS2 to the fourth rank 1250, the memory controller 1210 may provide the second data clock enable signal WCKSL to the fourth rank 1250. Based on the second data clock enable signal WCKSL, the fourth rank 1250 may synchronize the system clock signal and the data clock signals WCK and WCKB with each other.

The first rank 1220 may include an internal clock generating circuit 1221 and a synchronization enabling circuit 1222. Based on the data clock signals WCK and WCKB, the internal clock generating circuit 1221 may generate a plurality of internal clock signals INCK. The synchronization enabling circuit 1222 may control whether to activate the internal clock generating circuit 1221 and when to activate the internal clock generating circuit 1221 based on the first chip selection signal CS1 and the first data clock enable signal WCKSR. The second rank 1230 may include an internal clock generating circuit 1231 and a synchronization enabling circuit 1232. Based on the data clock signals WCK and WCKB, the internal clock generating circuit 1231 may generate a plurality of internal clock signals INCK. The synchronization enabling circuit 1232 may control whether to activate the internal clock generating circuit 1231 and when to activate the internal clock generating circuit 1231 based on the second chip selection signal CS2 and the first data clock enable signal WCKSR. The third rank 1240 may include an internal clock generating circuit 1241 and a synchronization enabling circuit 1242. Based on the data clock signals WCK and WCKB, the internal clock generating circuit 1241 may generate a plurality of internal clock signals INCK. The synchronization enabling circuit 1242 may control whether to activate the internal clock generating circuit 1241 and when to activate the internal clock generating circuit 1241 based on the first chip selection signal CS1 and the second data clock enable signal WCKSL. The fourth rank 1250 may include an internal clock generating circuit 1251 and a synchronization enabling circuit 1252. Based on the data clock signals WCK and WCKB, the internal clock generating circuit 1251 may generate a plurality of internal clock signals INCK. The synchronization enabling circuit 1252 may control whether to activate the internal clock generating circuit 1251 and when to activate the internal clock generating circuit 1251 based on the second chip selection signal CS2 and the second data clock enable signal WCKSL.

Internal clock generating circuits 1221, 1231, 1241 and 1251 and synchronization enabling circuit 1222, 1232, 1242 and 1252 within the respective first to fourth ranks 1220, 1230, 1240 and 1250 may have substantially the same configurations and may perform substantially the same operations respectively as the internal clock generating circuit 321 and the synchronization enabling circuit 322 illustrated in FIG. 4 or respectively as the internal clock generating circuit 721 and the synchronization enabling circuit 722 illustrated in FIG. 9. Further, the memory controller 1210, the first rank 1220 and the second rank 1230 may perform substantially the same operations as illustrated in FIG. 8 or as illustrated in FIGS. 10 and 11. Still further, the memory controller 1210, the third rank 1240 and the fourth rank 1250 may perform substantially the same operations as illustrated in FIG. 8 or as illustrated in FIGS. 10 and 11. For example, the operation of the memory system 1200 may be as follows. After accessing the first rank 1220 by providing the first chip selection signal CS1 to the first rank 1220, the memory controller 1210 may enable the first data clock enable signal WCKSR. Then, the memory controller 1210 may disable the first data clock enable signal WCKSR before accessing one of the first rank 1220 and the second rank 1230 by providing one of the first chip selection signal CS1 and the second chip selection signal CS2. After accessing the first rank 1220 by providing the first chip selection signal CS1 to the first rank 1220, the memory controller 1210 may enable the first data clock enable signal WCKSR. Then, the memory controller 1210 may disable the first data clock enable signal WCKSR when providing the second chip selection signal CS2 to the second rank 1230. Then, the memory controller 1210 may enable again the first data clock enable signal WCKSR after providing the second chip selection signal CS2. After accessing the third rank 1240 by providing the first chip selection signal CS1 to the third rank 1240, the memory controller 1210 may enable the second data clock enable signal WCKSL. Then, the memory controller 1210 may disable the second data clock enable signal WCKSL before accessing one of the third rank 1240 and the fourth rank 1250 by providing one of the first chip selection signal CS1 and the second chip selection signal CS2. After accessing the third rank 1240 by providing the first chip selection signal CS1 to the third rank 1240, the memory controller 1210 may enable the second data clock enable signal WCKSL. Then, the memory controller 1210 may disable the second data clock enable signal WCKSL when providing the second chip selection signal CS2 to the fourth rank 1250. Then, the memory controller 1210 may enable again the second data clock enable signal WCKSL after providing the second chip selection signal CS2. After accessing the first rank 1220 by providing the first chip selection signal CS1 to the first rank 1220, the memory controller 1210 may control the first data clock enable signal WCKSR to transition from a low logic level to a high logic level. Then, the memory controller 1210 may control the first data clock enable signal WCKSR to transition from a high logic level to a low logic level after accessing the second rank 1230 by providing the second chip selection signal CS2 to the second rank 1230. The first rank 1220 may synchronize, based on a rising edge of the first data clock enable signal WCKSR, the system clock signal SCK and the data clock signal WCK with each other. The second rank 1230 may synchronize, based on a falling edge of the first data clock enable signal WCKSR, the system clock signal SCK and the data clock signal WCK with each other. After accessing the third rank 1240 by providing the first chip selection signal CS1 to the third rank 1240, the memory controller 1210 may control the second data clock enable signal WCKSL to transition from a low logic level to a high logic level. Then, the memory controller 1210 may control the second data clock enable signal WCKSL to transition from a high logic level to a low logic level after accessing the fourth rank 1250 by providing the second chip selection signal CS2 to the fourth rank 1250. The third rank 1240 may synchronize, based on a rising edge of the second data clock enable signal WCKSL, the system clock signal SCK and the data clock signal WCK with each other. The fourth rank 1250 may synchronize, based on a falling edge of the second data clock enable signal WCKSL, the system clock signal SCK and the data clock signal WCK with each other.

Figure 13:
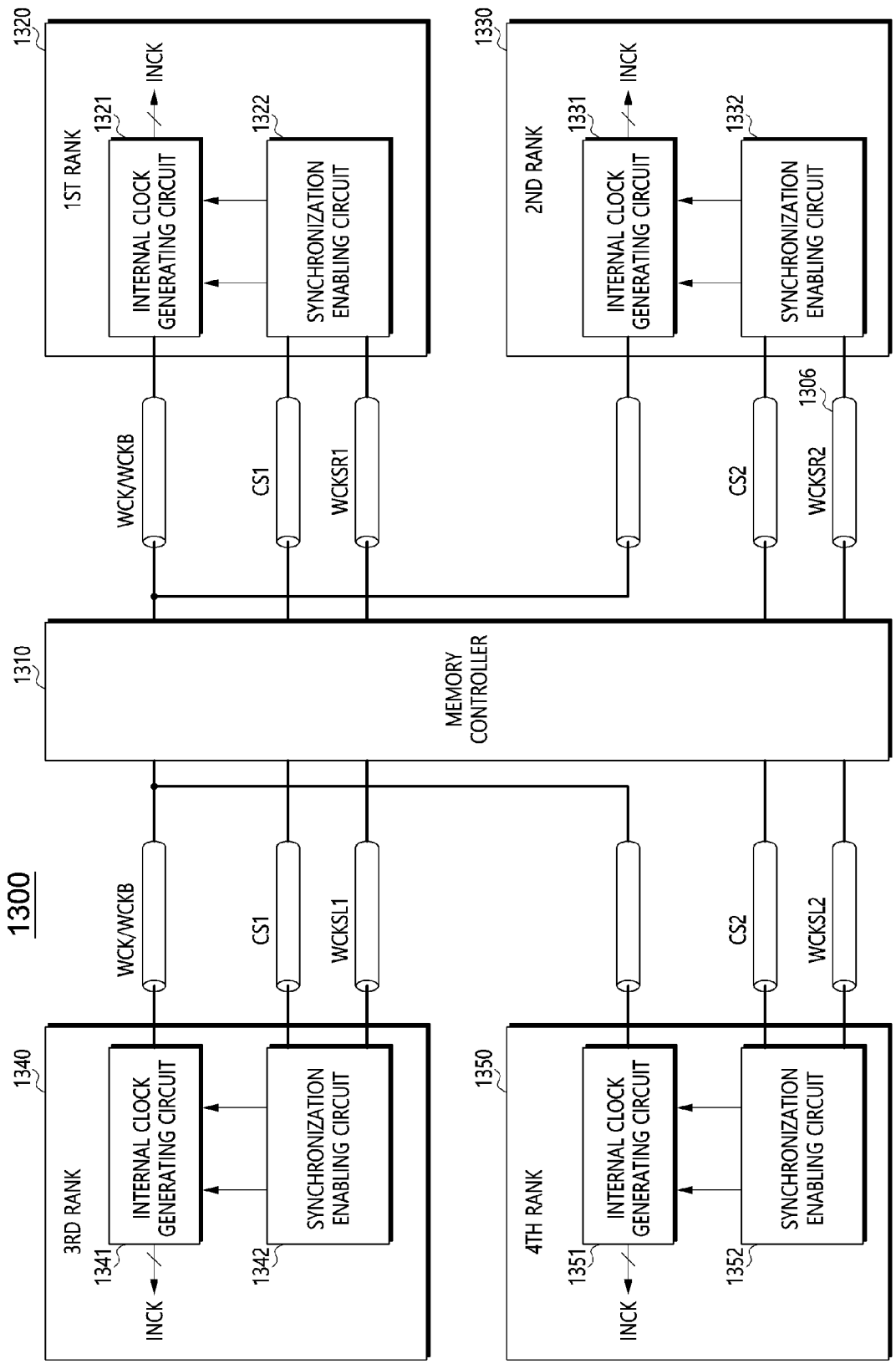
FIG. 13 is a diagram illustrating a configuration of a memory system in accordance with an embodiment.

FIG. 13 is a diagram illustrating a configuration of a memory system 1300 in accordance with an embodiment. Referring to FIG. 13, the memory system 1300 may include a memory controller 1310, a first rank 1320, a second rank 1330, a third rank 1340, and a fourth rank 1350. The memory controller 1310 may provide different clock enable signals to the respective first to fourth ranks 1320, 1330, 1340, and 1350. The memory controller 1310 may provide data clock signals WCK and WCKB, a first chip selection signal CS1, a second chip selection signal CS2, a first data clock enable signal WCKSR1, a second data clock enable signal WCKSR2, a third data clock enable signal WCKSL1, and a fourth data clock enable signal WCKSL2 to access the first rank 1320, the second rank 1330, the third rank 1340, and the fourth rank 1350. The memory controller 1310 may provide the data clock signals WCK and WCKB commonly to the first to fourth ranks 1320, 1330, 1340, and 1350. The memory controller 1310 may provide the first rank 1320 and the third rank 1340 with the first chip selection signal CS1 and may provide the second rank 1330 and the fourth rank 1350 with the second chip selection signal CS2. The memory controller 1310 may provide the first rank 1320 with the first data clock enable signal WCKSR1, may provide the second rank 1330 with the second data clock enable signal WCKSR2, may provide the third rank 1340 with the third data clock enable signal WCKSL1 and may provide the fourth rank 1350 with the fourth data clock enable signal WCKSL2.

The first rank 1320 may communicate with the memory controller 1310 based on the data clock signals WCK and WCKB, the first chip selection signal CS1, and the first data clock enable signal WCKSR1. The second rank 1330 may communicate with the memory controller 1310 based on the data clock signals WCK and WCKB, the second chip selection signal CS2, and the second data clock enable signal WCKSR2. The third rank 1340 may communicate with the memory controller 1310 based on the data clock signals WCK and WCKB, the first chip selection signal CS1, and the third data clock enable signal WCKSL1. The fourth rank 1350 may communicate with the memory controller 1310 based on the data clock signals WCK and WCKB, the second chip selection signal CS2, and the fourth data clock enable signal WCKSL2.

After accessing the first rank 1320 by providing the first chip selection signal CS1 to the first rank 1320, the memory controller 1310 may provide the first data clock enable signal WCKSR1 to the first rank 1320. Based on the first data clock enable signal WCKSR1, the first rank 1320 may synchronize a system clock signal and the data clock signals WCK and WCKB with each other. The memory controller 1310 may disable the first data clock enable signal WCKSR1 before accessing again the first rank 1320 by providing again the first chip selection signal CS1. After accessing the second rank 1330 by providing the second chip selection signal CS2 to the second rank 1330, the memory controller 1310 may provide the second data clock enable signal WCKSR2 to the second rank 1330. Based on the second data clock enable signal WCKSR2, the second rank 1330 may synchronize the system clock signal and the data clock signals WCK and WCKB with 5 each other. The memory controller 1310 may disable the second data clock enable signal WCKSR2 before accessing again the second rank 1330 by providing again the second chip selection signal CS2. After accessing the third rank 1340 by providing the first chip selection signal CS1 to the third rank 1340, the memory controller 1310 may provide the third data clock enable signal WCKSL1 to the third rank 1340. Based on the third data clock enable signal WCKSL1, the third rank 1340 may synchronize the system clock signal and the data clock signals WCK and WCKB with each other. The memory controller 1310 may disable the third data clock enable signal WCKSL1 before accessing again the third rank 1340 by providing again the first chip selection signal CS1. After accessing the fourth rank 1350 by providing the second chip selection signal CS2 to the fourth rank 1350, the memory controller 1310 may provide the fourth data clock enable signal WCKSL2 to the fourth rank 1350. Based on the fourth data clock enable signal WCKSL2, the fourth rank 1350 may synchronize the system clock signal and the data clock signals WCK and WCKB with each other. The memory controller 1310 may disable the fourth data clock enable signal WCKSL2 before accessing again the fourth rank 1350 by providing again the second chip selection signal CS2.

The first rank 1320 may include an internal clock generating circuit 1321 and a synchronization enabling circuit 1322. Based on the data clock signals WCK and WCKB, the internal clock generating circuit 1321 may generate a plurality of internal clock signals INCK. The synchronization enabling circuit 1322 may control whether to activate the internal clock generating circuit 1321 and when to activate the internal clock generating circuit 1321 based on the first chip selection signal CS1 and the first data clock enable signal WCKSR1. The second rank 1330 may include an internal clock generating circuit 1331 and a synchronization enabling circuit 1332. Based on the data clock signals WCK and WCKB, the internal clock generating circuit 1331 may generate a plurality of internal clock signals INCK. The synchronization enabling circuit 1332 may control whether to activate the internal clock generating circuit 1331 and when to activate the internal clock generating circuit 1331 based on the second chip selection signal CS2 and the second data clock enable signal WCKSR2. The third rank 1340 may include an internal clock generating circuit 1341 and a synchronization enabling circuit 1342. Based on the data clock signals WCK and WCKB, the internal clock generating circuit 1341 may generate a plurality of internal clock signals INCK. The synchronization enabling circuit 1342 may control whether to activate the internal clock generating circuit 1341 and when to activate the internal clock generating circuit 1341 based on the first chip selection signal CS1 and the third data clock enable signal WCKSL1. The fourth rank 1350 may include an internal clock generating circuit 1351 and a synchronization enabling circuit 1352. Based on the data clock signals WCK and WCKB, the internal clock generating circuit 1351 may generate a plurality of internal clock signals INCK. The synchronization enabling circuit 1352 may control whether to activate the internal clock generating circuit 1351 and when to activate the internal clock generating circuit 1351 based on the second chip selection signal CS2 and the fourth data clock enable signal WCKSL2. Internal clock generating circuits 1321, 1331, 1341 and 1351 and synchronization enabling circuits 1322, 1332, 1342 and 1352 within the respective first to fourth ranks 1320, 1330, 1340 and 1350 may have substantially the same configurations and may perform substantially the same operations respectively as the internal clock generating circuit 321 and the synchronization enabling circuit 322 illustrated in FIG. 4. Further, the memory controller 1310, the first rank 1320, the second rank 1330, the third rank 1340 and the fourth rank 1350 may perform substantially the same operations as illustrated in FIGS. 5 and 8.

While certain embodiments have been described above, it will be understood to those skilled in the art that the embodiments described are by way of example only. Accordingly, the memory system efficiently performing clock synchronization should not be limited based on the described embodiments. Rather, in an embodiment, the memory system efficiently performing clock synchronization described herein should only be limited in light of the claims that follow when taken in conjunction with the above description and accompanying drawings.

What is claimed is:

1. A memory system comprising:
    a memory controller configured to perform a memory access by providing a system clock signal, a data clock signal, and a chip selection signal; and
    a memory device configured to communicate with the memory controller based on the system clock signal, the data clock signal, the chip selection signal, and the data clock enable signal,
    wherein the memory controller is configured to provide a data clock enable signal to the memory device after the memory access.

2. The memory system of claim 1, wherein the memory controller is configured to enable the data clock enable signal during a section, in which each of the system clock signal and the data clock signal has a low logic level.

3. The memory system of claim 1,
    wherein the memory controller is configured to enable the data clock enable signal during a section from a time-point when half of a unit interval (UI) elapses after the system clock signal transitions to a low logic level to a time-point when half of the UI elapses after the system clock signal transitions to a high logic level, and
    wherein one (1) UI corresponds to a half-period of the data clock signal.

4. The memory system of claim 1, wherein the memory device is configured to synchronize, based on the data clock enable signal, the system clock signal and the data clock signal with each other.

5. The memory system of claim 1, wherein the memory device includes:
    an internal clock generating circuit configured to receive the data clock signal to generate a plurality of internal clock signals based on the data clock signal; and
    a synchronization enabling circuit configured to activate the internal clock generating circuit based on the chip selection signal and the data clock enable signal.

6. The memory system of claim 5, wherein the internal clock generating circuit includes:
    a clock buffer configured to buffer the data clock signal; and
    a clock dividing circuit configured to frequency-divide an output signal of the clock buffer to generate the plurality of internal clock signals.

7. The memory system of claim 6, wherein the synchronization enabling circuit includes:
    a buffer enabling circuit configured to generate a first enable signal based on the chip selection signal; and
    a clock enablement control circuit configured to generate a second enable signal based on the data clock enable signal.

8. The memory system of claim 7, wherein the clock buffer is activated on a basis of the first enable signal and the clock dividing circuit is activated on a basis of the second enable signal.

9. The memory system of claim 7, wherein the clock buffer is partially activated on a basis of the first enable signal and fully activated on a basis of the second enable signal.

10. The memory system of claim 7, wherein the clock dividing circuit is partially activated on a basis of the first enable signal and fully activated on a basis of the second enable signal.

11. A memory system comprising:
a memory controller configured to provide a system clock signal, a data clock signal, a first chip selection signal, a second chip selection signal, and a data clock enable signal;
a first rank configured to communicate with the memory controller based on the system clock signal, the data clock signal, the first chip selection signal, and the data clock enable signal; and
a second rank configured to communicate with the memory controller based on the system clock signal, the data clock signal, the second chip selection signal, and the data clock enable signal,
wherein the memory controller is configured to provide the data clock enable signal after accessing at least one of the first rank and the second rank.

12. The memory system of claim 11, wherein the memory controller is configured to enable the data clock enable signal during a section, in which each of the system clock signal and the data clock signal has a low logic level.

13. The memory system of claim 11,
wherein the memory controller is configured to enable the data clock enable signal during a section from a time-point when half of a unit interval (UI) elapses after the system clock signal transitions to a low logic level to a time-point when half of the UI elapses after the system clock signal transitions to a high logic level, and
wherein one (1) UI corresponds to a half-period of the data clock signal.

14. The memory system of claim 11, wherein the memory controller is configured to:
enable the data clock enable signal after performing a first access by providing one of the first chip selection signal and the second chip selection signal, and
disable the data clock enable signal before or simultaneously when performing a second access by providing one of the first chip selection signal and the second chip selection signal.

15. The memory system of claim 11, wherein the first rank is configured to synchronize, after receiving the first chip selection signal, the system clock signal and the data clock signal with each other based on the data clock enable signal.

16. The memory system of claim 11, wherein the second rank is configured to synchronize, after receiving the second chip selection signal, the system clock signal and the data clock signal with each other based on the data clock enable signal.

17. The memory system of claim 11, wherein the memory controller is configured to:
control the data clock enable signal to transition from a low logic level to a high logic level after providing one of the first chip selection signal and the second chip selection signal, and
control the data clock enable signal to transition from a high logic level to a low logic level after providing the other one of the first chip selection signal and the second chip selection signal.

18. The memory system of claim 17,
wherein one of the first rank and the second rank is configured to synchronize the system clock signal and the data clock signal with each other based on a rising edge of the data clock enable signal, and
wherein the other one of the first rank and the second rank is configured to synchronize the system clock signal and the data clock signal with each other based on a falling edge of the data clock enable signal.

* * * * *